(12) United States Patent
Tsao et al.

(10) Patent No.: US 8,187,776 B2
(45) Date of Patent: May 29, 2012

(54) COLOR FILTER SUBSTRATE, ELECTRONIC APPARATUS AND MANUFACTURING METHOD THEREOF

(75) Inventors: Chun-Chieh Tsao, Taoyuan County (TW); Han-Tu Lin, Taichung County (TW)

(73) Assignee: Au Optronics Corporation, Hsinchu (TW)

( * ) Notice: Subject to any disclaimer, the term of this patent is extended or adjusted under 35 U.S.C. 154(b) by 779 days.

(21) Appl. No.: 12/242,935

(22) Filed: Oct. 1, 2008

(65) Prior Publication Data

US 2010/0007975 A1    Jan. 14, 2010

(30) Foreign Application Priority Data

Jul. 10, 2008    (TW) .............................. 97126185 A

(51) Int. Cl.
*G02B 5/20* (2006.01)
*G03F 1/00* (2006.01)

(52) U.S. Cl. ........................................... 430/7; 359/891

(58) Field of Classification Search ......................... None
See application file for complete search history.

(56) References Cited

U.S. PATENT DOCUMENTS

| | | | |
|---|---|---|---|
| 5,907,377 A | 5/1999 | Nishida et al. | |
| 6,259,499 B1 | 7/2001 | Yamanashi | |
| 6,787,275 B2 * | 9/2004 | Kawase | 430/7 |
| 6,809,791 B2 | 10/2004 | Yi et al. | |
| 6,927,819 B2 | 8/2005 | Jeong | |
| 7,029,807 B2 | 4/2006 | Sakurada et al. | |
| 7,265,808 B2 | 9/2007 | Yi et al. | |
| 2004/0146791 A1 * | 7/2004 | Sakurada et al. | 430/7 |
| 2008/0030658 A1 * | 2/2008 | Matsuhita | 349/106 |

FOREIGN PATENT DOCUMENTS

JP    2005302308    10/2005

* cited by examiner

*Primary Examiner* — Cynthia Kelly
*Assistant Examiner* — Anna Verderame
(74) *Attorney, Agent, or Firm* — Jianq Chyun IP Office

(57) ABSTRACT

A color filter substrate is provided. The color filter substrate includes a substrate, a light-shielding layer, and a plurality of color filter patterns. The substrate has a plurality of annular trough areas, a plurality of central areas, and a light-shielding area positioned among the annular trough areas. Each of the annular trough areas has an inner edge connected to the central area and an outer edge connected to the light-shielding area. The light-shielding layer is disposed on the light-shielding area and extends from the outer edges of the annular trough areas to the top of the annular trough areas. The color filter patterns are disposed on the annular trough areas and the central areas, and the color filter patterns are in contact with a side surface and a part of the bottom surface of the light-shielding layer.

11 Claims, 30 Drawing Sheets

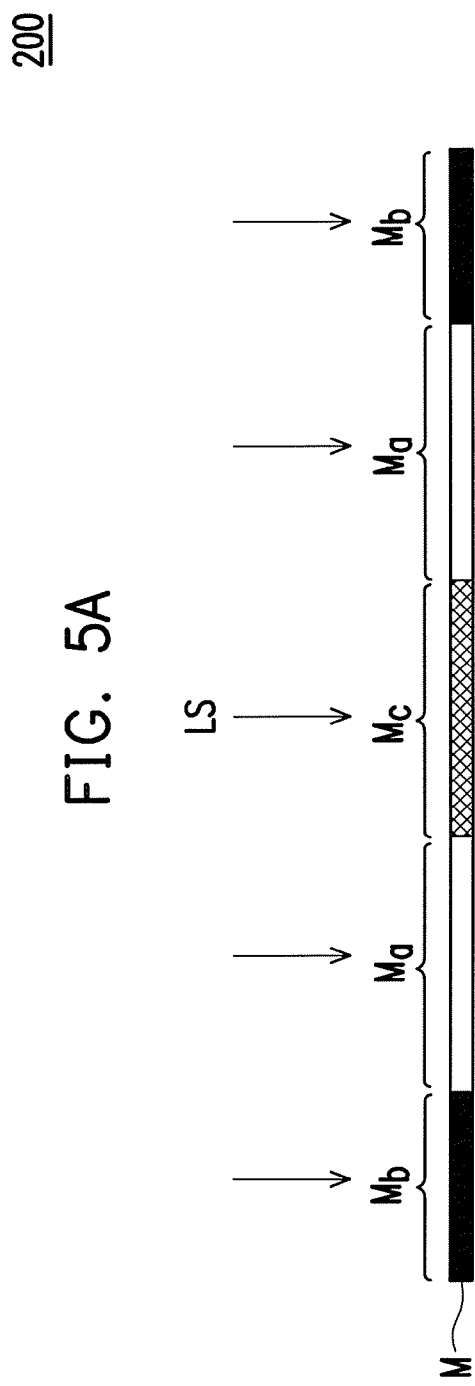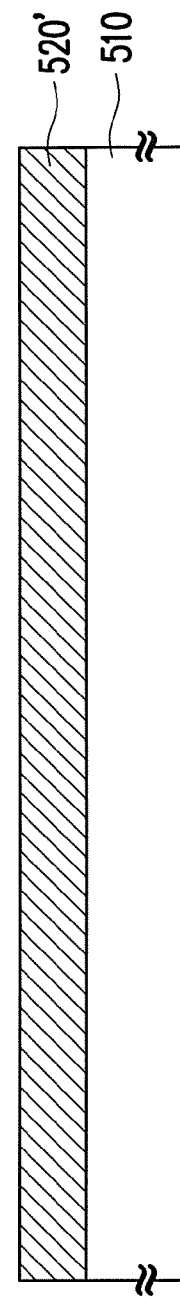
FIG. 5A    FIG. 5B

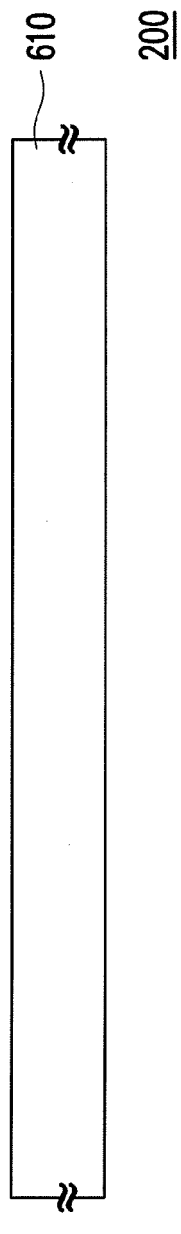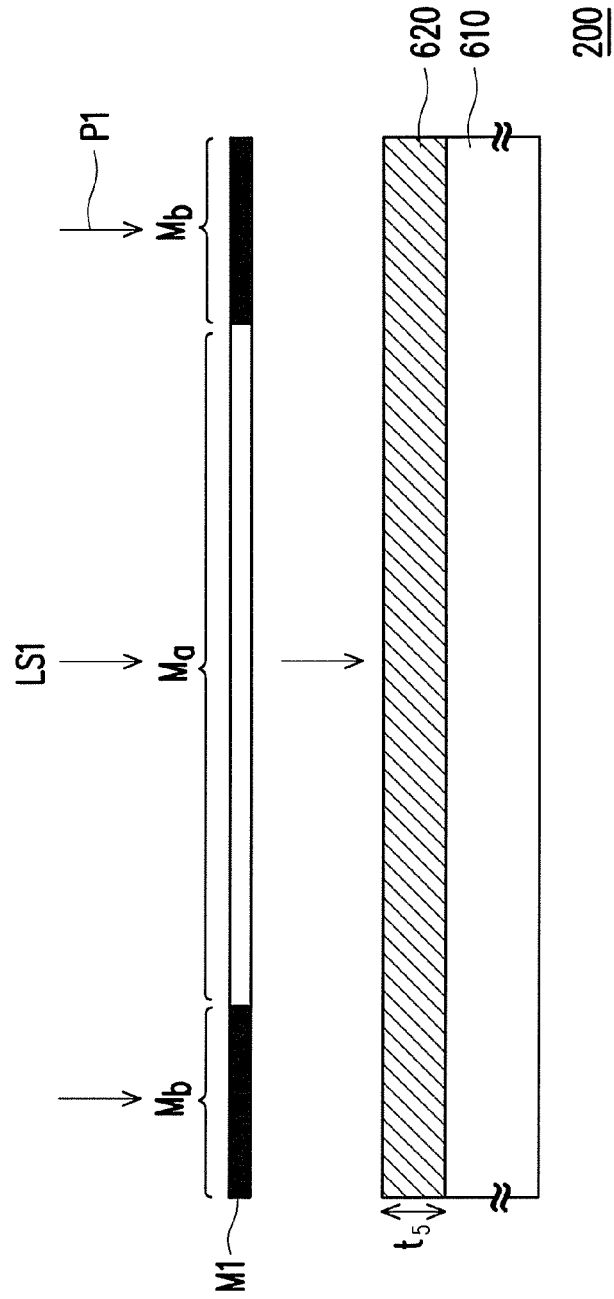
FIG. 6A
FIG. 6B

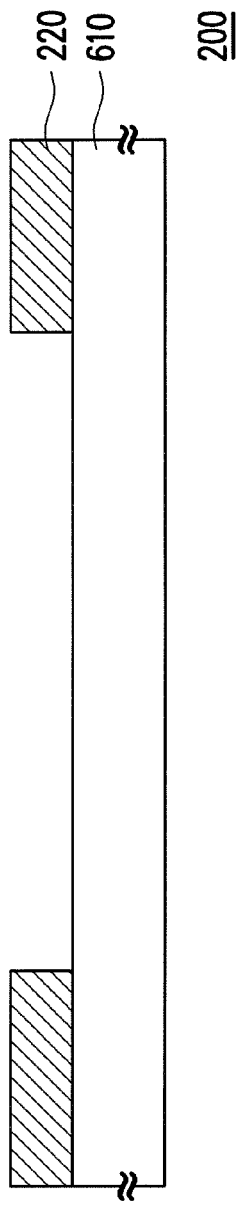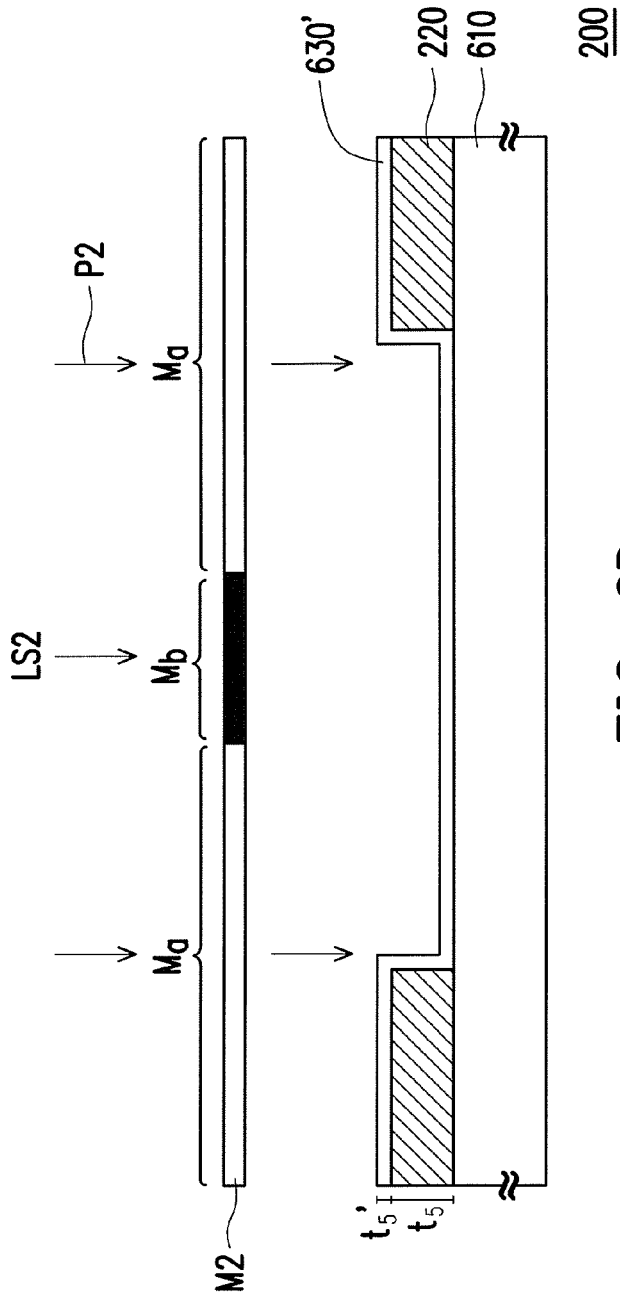

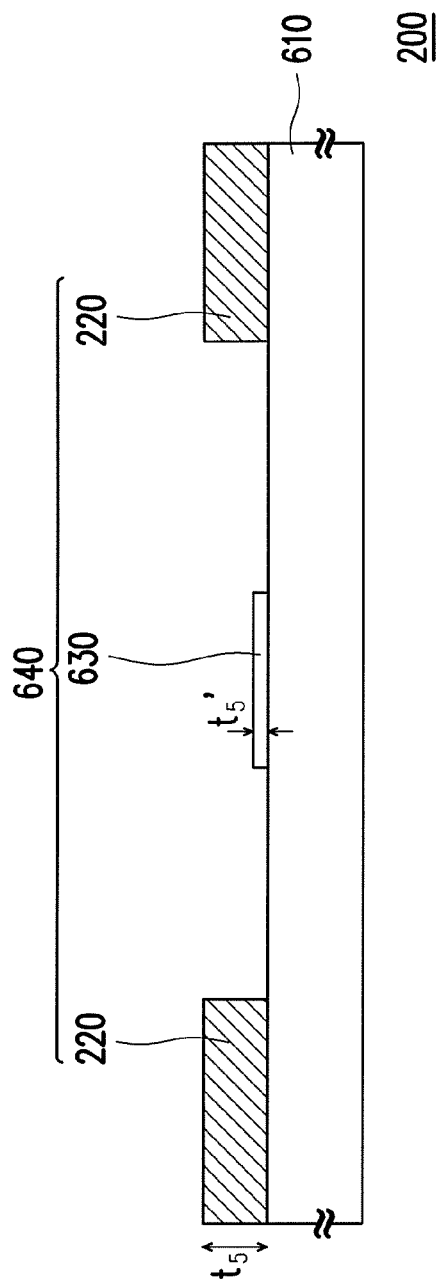
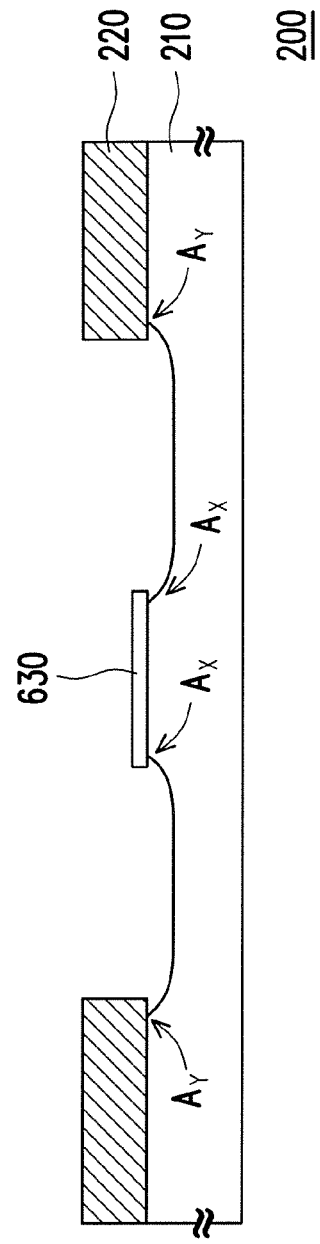

COLOR FILTER SUBSTRATE, ELECTRONIC APPARATUS AND MANUFACTURING METHOD THEREOF

CROSS-REFERENCE TO RELATED APPLICATION

This application claims the priority benefit of Taiwan application serial no. 97126185, filed on Jul. 10, 2008. The entirety of the above-mentioned patent application is hereby incorporated by reference herein and made a part of specification.

BACKGROUND OF THE INVENTION

1. Field of the Invention

The present invention generally relates to a color filter substrate and a manufacturing method thereof, and more particularly, to a color filter substrate adapted for applying in a transflective liquid crystal display (LCD) panel and a manufacturing method thereof.

2. Description of Related Art

An LCD does not emit light itself. Therefore, an LCD panel has to work together with a light source (e.g., a backlight source, a front light source, or an ambient light source), for displaying images. Light sources are utilized in different ways by different LCDs. According to the different ways of utilizing the light sources, LCDs can be categorized into three modes, transmissive, reflective and transflective. Currently, transflective LCDs are being paid of more attention, because they can work with light provided by the ambient light source and the backlight source at the same time, and thus are more suitable for portable products.

FIG. 1A is a partial cross-sectional view of a conventional transflective LCD. Referring to FIG. 1A, it shows a transflective LCD 150. The transflective LCD 150 includes a display panel 140, and a backlight module (not shown). The display panel 140 is mainly constituted by a color filter substrate 100, a pixel array substrate 112 disposed opposite to the color filter substrate 100, and a liquid crystal layer 114 disposed between the color filter substrate 100 and the pixel array substrate 112. The color filter substrate 100 includes a substrate 110 without any patterns thererin, a light-shielding layer 120, a plurality of color filter patterns 130 (only one color filter pattern 130 shown in the drawing for illustration purpose), an overcoat layer 102, and a transparent electrode 104. Each of the color filter patterns 130 includes a first pattern 130a and a second pattern 130b. The overcoat layer 102 and the transparent electrode 104 are sequentially disposed covering the light-shielding layer 120 and the color filter patterns 130. The pixel array substrate 112 includes a pixel array (only one pixel 112P is shown in FIG. 1A for illustrating the pixel array), and a peripheral circuit (not shown) coupled to the pixel array. The pixel array includes transmissive display regions T1 and reflective display regions R1 respectively corresponding to the first patterns 130a and the second patterns 130b.

The peripheral circuit is provided for driving the pixel 112P of the pixel array, so as to allow a backlight BL' provided by a backlight module transmitting through the transmissive display region T1 for displaying images, and to allow an ambient light EL' being reflected by a reflective electrode 112R disposed in the reflective display region R1 for displaying images. However, light in the reflective display region R1 transmits the color filter substrate 100 for two times, while light in the transmissive display region T1 is directly emitted from the backlight source and transmits the color filter substrate for only one time. Therefore, in such a pixel 112P of the transflective LCD 150, colors of images displayed by the reflective display region R1 and images displayed by the transmissive display region T1 would be looked inharmonic.

In order to eliminate the inharmony mentioned above, the thickness of the color filter patterns 130 in the color filter substrate 100 can be adjusted, so as to form the first patterns 130a and the second patterns 130b with different thicknesses. Specifically, the thickness $t_a$ of the first patterns 130a which correspond to the transmissive display region T1 is increased, or otherwise the thickness $t_b$ of the second patterns which correspond to the reflective display region R1 is decreased. Generally speaking, the thickness $t_a$ of the first patterns 130a is substantially two times of the thickness $t_b$ of the second patterns 130b. In such a way, lights transmitting through the transmissive display region T1 and the reflective display region R1 are affected by the color filter patterns 130 for a similar degree, and thus achieving color harmony.

Typically, the light-shielding layer 120 is employed as a partition to obtain color filter patterns 130 having different thicknesses. However, the employment of the light-shielding layer 120 will cause a decrease of an aperture ratio (AR) of the transflective LCD 150, and thus affecting the entire brightness performance of the transflective LCD 150. Furthermore, although photolithography and etching processes can be used for configuring the color filter patterns 130 having different thicknesses, such steps make the process more complicated, and thus increase the production cost.

FIG. 1B is a partial cross-sectional view of another conventional transflective LCD. Referring to FIG. 1B, it shows a transflective LCD 150' having a configuration and components similar with that of the transflective LCD 150 as shown in FIG. 1A, except that the transflective LCD 150' does not include an overcoat layer. Each color filter pattern 130 includes a first pattern 130a' corresponding to the transmissive display region T1 and a second pattern 130b' corresponding to the reflective display region R1, and the first patterns 130a' and the second patterns 130b' have an equivalent thickness. The transflective LCD 150' configures the first patterns 130a' and the second patterns 130b' with different materials. Although such a design improves the color inharmony, fabricating the color filter patterns 130' with different materials makes the process more difficult and more complicated.

SUMMARY OF THE INVENTION

Accordingly, the present invention is directed to provide a color filter substrate including color filter patterns having two different thicknesses.

The present invention is further directed to provide a method of manufacturing a color filter substrate, adapted for decreasing a process complexity of fabricating the foregoing color filter substrate.

The present invention is further directed to provide an electronic apparatus including a foregoing color filter substrate.

The present invention is still directed to provide a method for manufacturing an electronic apparatus including a foregoing color filter substrate.

The present invention provides a color filter substrate. The color filter substrate includes a substrate, a light-shielding layer, and a plurality of color filter patterns. The substrate has a plurality of annular trough areas, a plurality of central areas, and a light-shielding area positioned among the annular trough areas. Each of the annular trough areas has an inner edge connected with a corresponding central area and an outer edge connected with the light-shielding area. The light-shielding layer is disposed on the light-shielding area, and extending from the outer edges to tops of the annular trough areas. The color filter patterns are disposed on the annular trough areas and the central areas, and in contact with a side surface and a part of a bottom surface of the light-shielding layer.

The present invention further provides a method of manufacturing a color filter substrate. The method includes at least following descriptions. A substrate including a light-shielding layer formed thereon is provided, in which the substrate includes a plurality of annular trough areas, a plurality of central areas, and a light-shielding area positioned among the annular trough areas, and each of the annular trough areas has an inner edge connected with a corresponding central area and an outer edge connected with the light-shielding area. Besides, the light-shielding layer is disposed on the light-shielding area, and extending from the outer edges to tops of the annular trough areas. A plurality of color filter patterns are formed on the annular trough areas and the central areas to make the color filter patterns be in contact with a side surface and a part of a bottom surface of the light-shielding layer.

The present invention further provides an electronic apparatus including the foregoing color filter substrate.

The present invention further provides a method of manufacturing an electronic apparatus, including the foregoing method of manufacturing the color filter substrate.

The color filter substrate according to the present invention includes color filter patterns having two different thicknesses. As such, the color filter patterns according to the present invention are adapted for a transflective LCD. Further, the method of manufacturing the color filter substrate is adapted to achieve color filter patterns with a relatively even upper surface. When such a color filter pattern is employed in a display, the optical performance of the display can be improved.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIGS. 5A through 5E are cross-sectional views illustrating a flow of fabricating annular trough areas according to a first embodiment of the present invention.

FIGS. 6A through 6G are cross-sectional views illustrating a flow of forming annular trough areas according to a second embodiment of the present invention.

DESCRIPTION OF THE EMBODIMENTS

First Embodiment

Figure 1A:
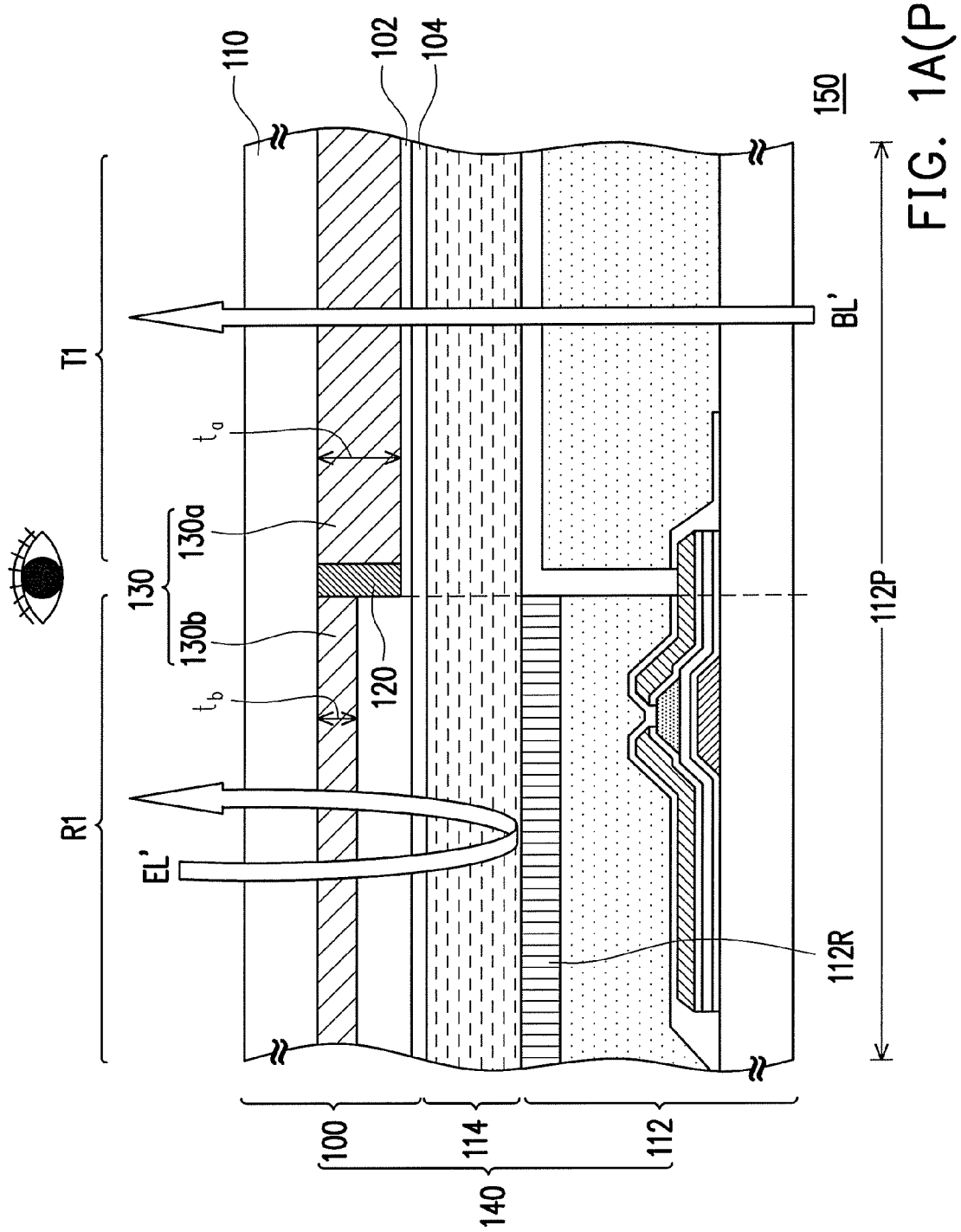
FIG. 1A is a partial cross-sectional view of a conventional transflective LCD.
Figure 1B:
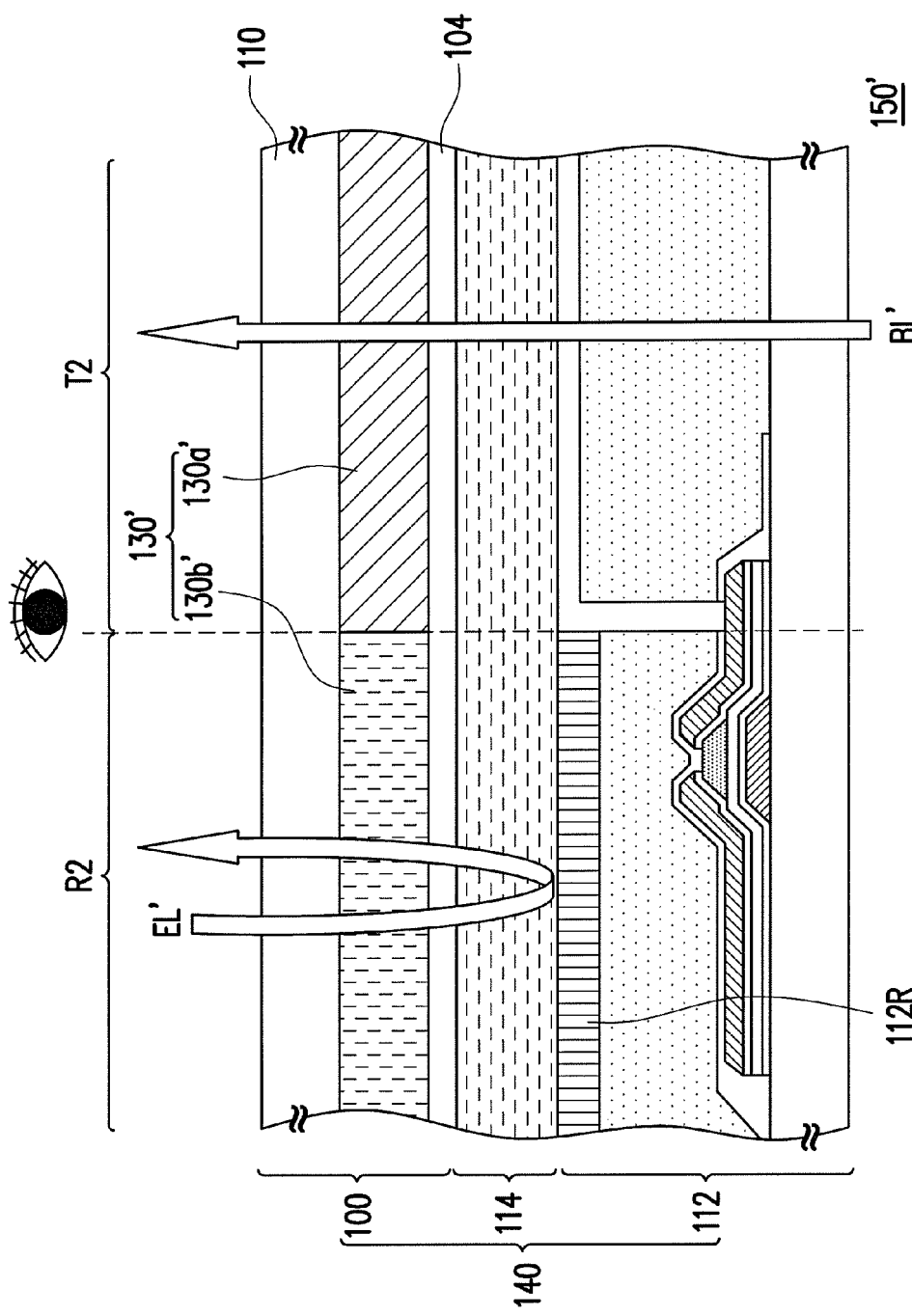
FIG. 1B is a partial cross-sectional view of another conventional transflective LCD.

Reference will now be made in detail to the present preferred embodiments of the invention, examples of which are illustrated in the accompanying drawings. Wherever possible, the same reference counting numbers are used in the drawings and the description to refer to the same or like parts.

Figure 2A:
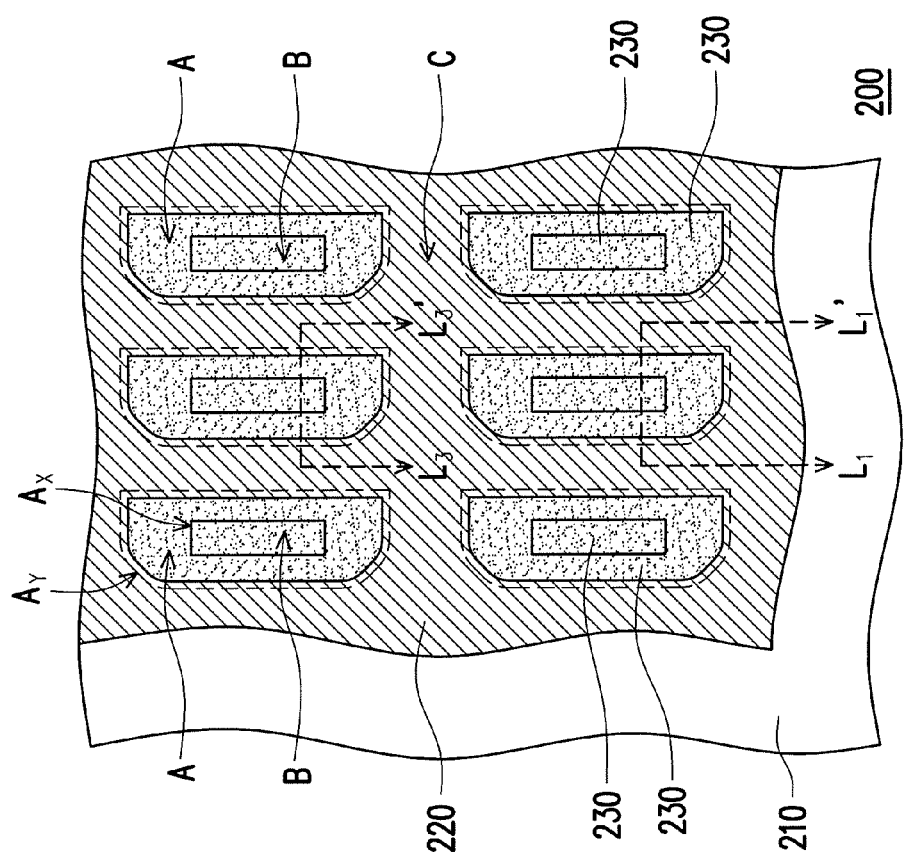
FIG. 2A is a partial top view of a color filter substrate according to an embodiment of the present invention.

FIG. 2A is a partial top view of a color filter substrate according to an embodiment of the present invention. Referring to FIG. 2A, it shows a color filter substrate 200 including a substrate 210, a light-shielding layer 220, and a plurality of color filter patterns 230. There are a plurality of annular trough areas A, a plurality of central areas B, and a light-shielding area C among the annular trough areas A, disposed inside the substrate 210.

Figure 2B:
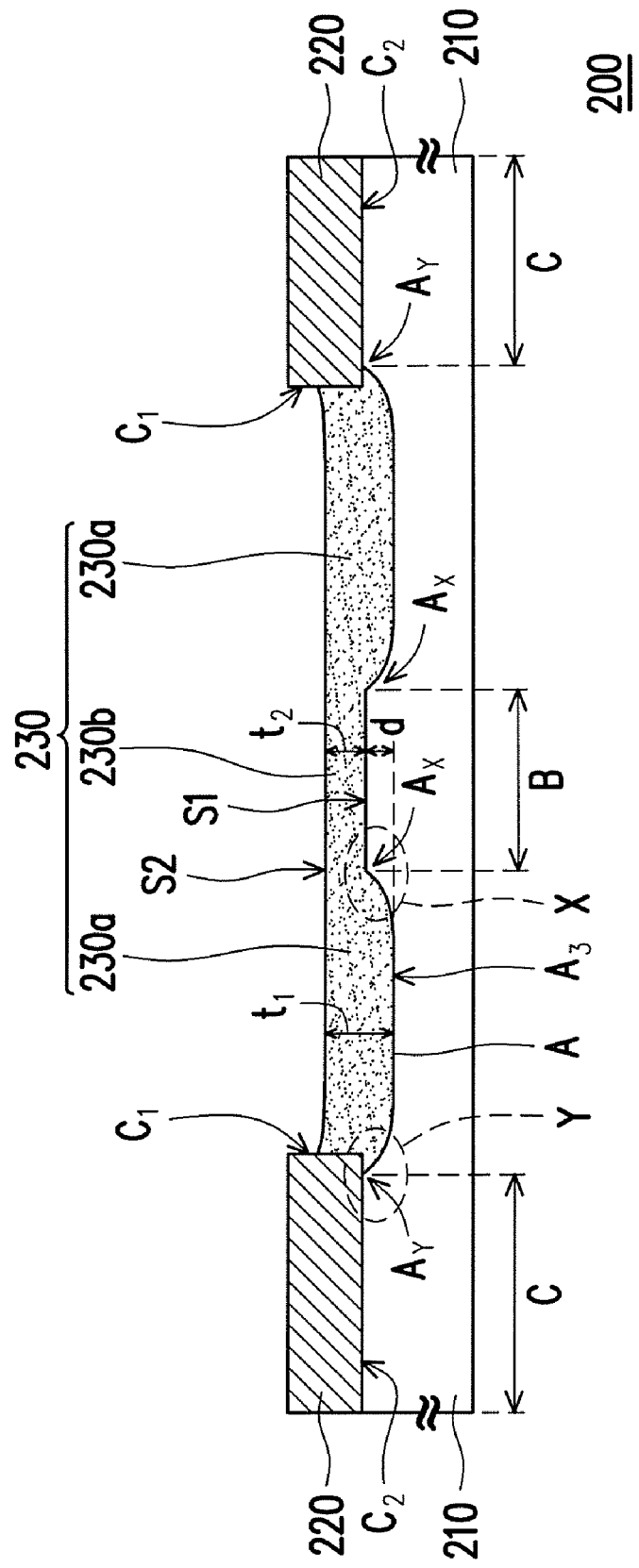
FIG. 2B is a cross-sectional view of FIG. 2A along line $L_1$-$L_1'$.

FIG. 2B is a cross-sectional view of FIG. 2A along line $L_1$-$L_1'$, in which only one color filter pattern 230 and a corresponding annular trough area A are shown for illustration purpose to as an example. Referring to FIG. 2B, the central area B and the light-shielding area C on the substrate 210 are preferably positioned at a same plane S1 as an example, but not limited. The annular trough area A is configured with an inner edge $A_X$ and an outer edge $A_Y$. The inner edge $A_X$ is connected with the central area B, and the outer edge $A_Y$ is connected with the light-shielding area C. Further, the light-shielding layer 220 is disposed on the light-shielding area C, and extending from the outer edge $A_Y$ to a top of the annular trough area A. The color filter pattern 230 is disposed on the annular trough area A and the central area B, and in contact with a side surface C1 of the light-shielding layer 220 and a part of a bottom surface C2 of the light-shielding layer 220. Specifically, the light-shielding layer 220 covers only a part of the color filter pattern 230.

Further, in the present embodiment, each annular trough area A has a bottom A3. The bottom A3 can be configured as an even bottom or an uneven bottom. According to the present invention, the bottom is preferred to be but not restricted to be an even bottom. A depth measured at the even bottom A3 with respect to the annular trough area A is defined as a maximum depth d. The maximum depth d is for example about 1 micron, in which the value of the depth for example can be an average of values measured from multi-points or a value measured from a single point. Further, depths near an inner edge position X or an outer edge position Y are substantially smaller than the maximum depth d, in which the annular trough area A has a smaller depth at a position farther apart from the even bottom A3. In other words, the depth of the annular trough area A gradually decreases when approaching to the inner edge position X and the outer edge position Y.

Further referring to FIG. 2B, the color filter pattern 230 has an upper surface S2. In the instant embodiment, the upper surface S2 is preferred to be substantially even. However, the present invention does not restrict the upper surface S2 to be even, while it can also be an uneven upper surface. Further, each color filter pattern 230 includes a first pattern 230a and a second pattern 230b. The first pattern 230a is disposed on the annular trough area 230, while the second pattern 230b is disposed on the central area B. For example, when a thickness $t_1$ of the first pattern 230a is substantially two times of a thickness $t_2$ of the second pattern 230b as preferred, the upper surface S2 of the color filter pattern 230 presents an even configuration, and therefore the thickness $t_2$ of the second pattern 230b of the color filter pattern 230 is substantially equivalent to the maximum depth d of the annular trough area A. However, the present invention is not restricted as such, and in other embodiments, the thickness $t_1$ of the first pattern $230_a$ for example can be other multiples (e.g., a natural number greater than 0) of the thickness $t_2$ of the second pattern 230b, in which the thickness $t_1$ is substantially greater than the thickness $t_2$.

Figure 3A:
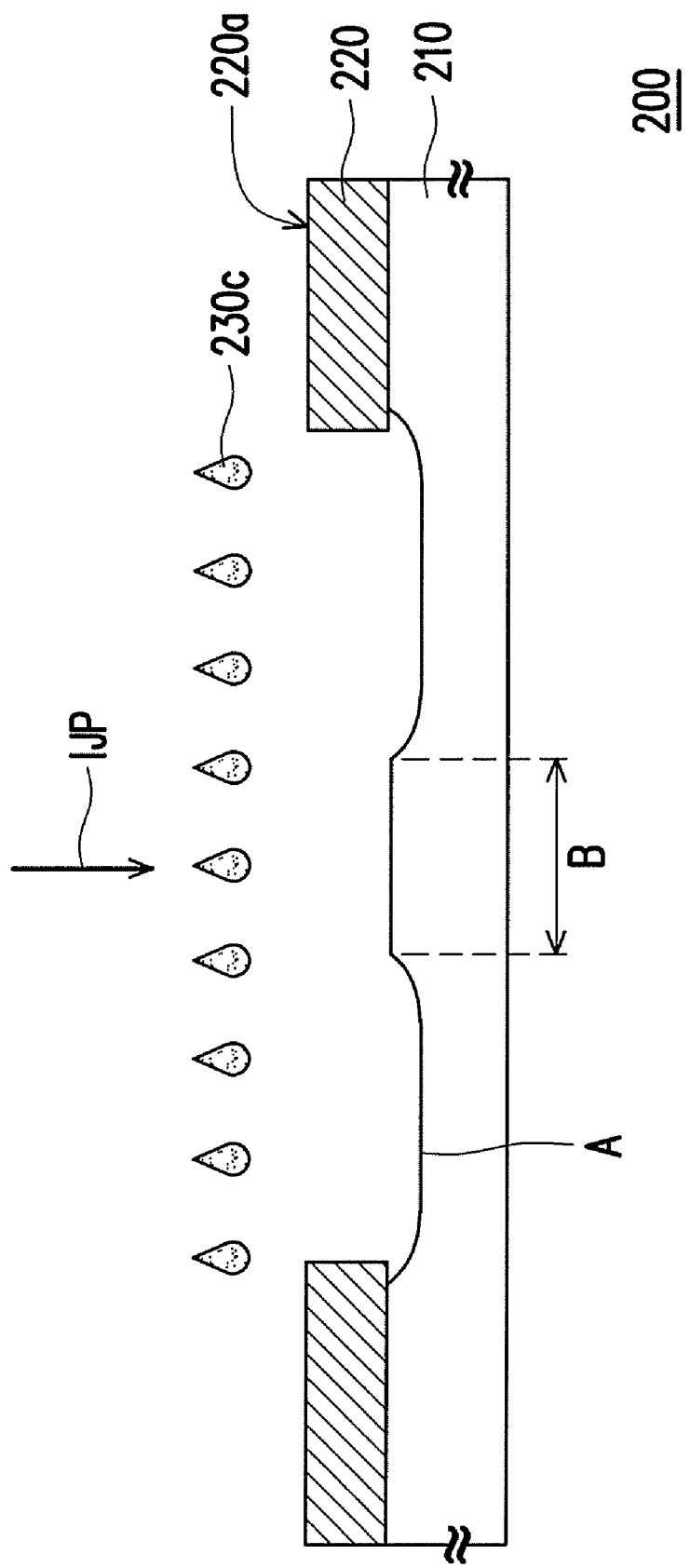
FIGS. 3A and 3B are schematic cross-sectional views illustrating a flow of forming color filter patterns with an ink-jet printing process according to an embodiment of the present invention.
Figure 3B:
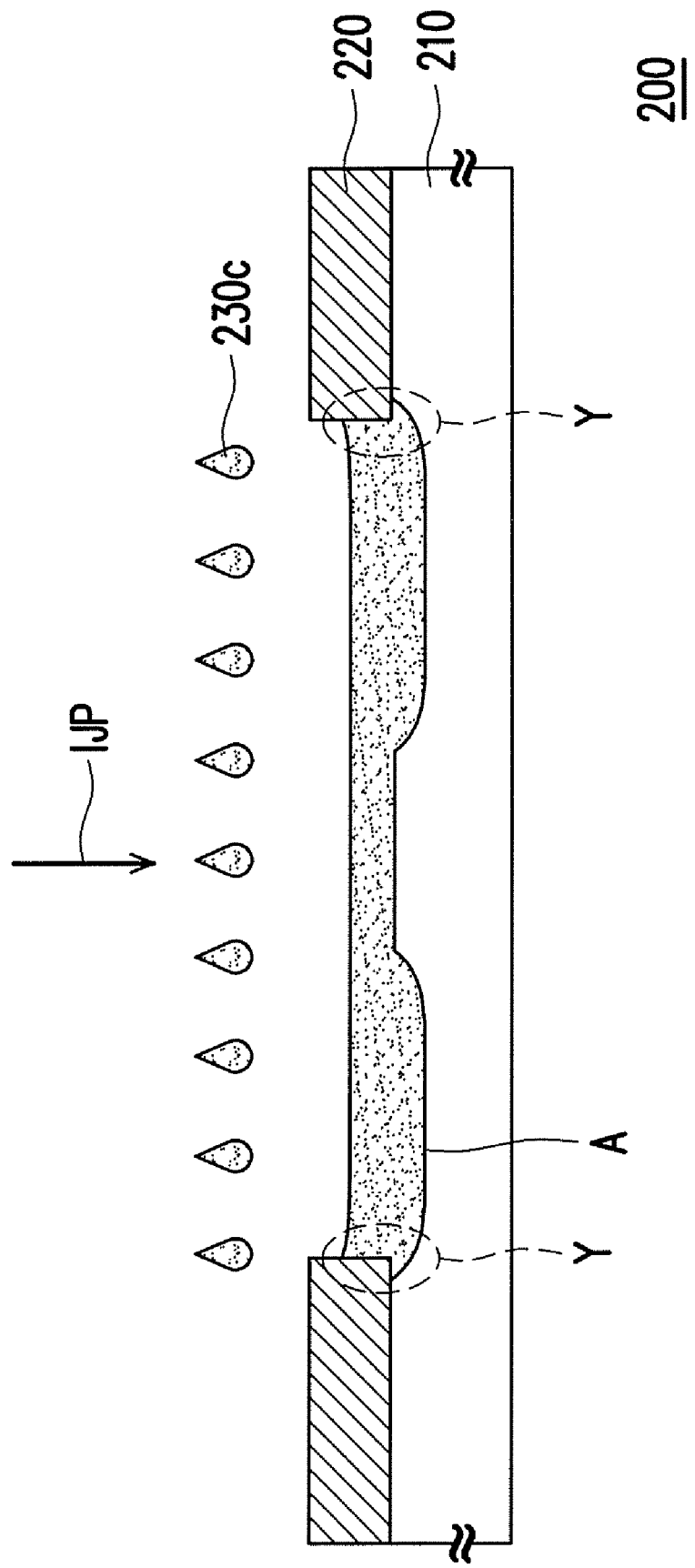

Preferably, the instant embodiment is preferred but not restricted to employ an ink-jet printing (IJP) process to configure the foregoing color filter patterns 230 by spraying color inks 230c to the substrate 210. In other embodiments, other conventional processes, such as spin coating, photolithography and etching processes, or net printing process, can also be employed. FIGS. 3A and 3B are schematic cross-sectional views illustrating a flow of forming color filter patterns with an ink-jet printing process according to an embodiment of the present invention, in which FIGS. 3A and 3B are cross-sectional views along line $L_1$-$L_1$' of FIG. 2A. Firstly, referring to FIG. 3A, when the color ink 230c is ink-jet printed to annular trough area A and the central area B of the substrate 210, it may be happened that a small amount of the color ink 230c is sprayed to or remained on the light-shielding layer 220. In order to prevent the color ink 230c from being remained on the light-shielding layer 220, the light-shielding layer 220 is preferably to have a hydrophobic characteristic. As such, the light-shielding layer 220 can be a hydrophobic layer 220a, and therefore the color ink 230c is not easy to flow over the light-shielding layer 220. In some other embodiments, the hydrophobic layer 220a is preferably a black matrix layer with a hydrophobically treated surface. Further, in other embodiments, the color ink 230c remained on the light-shielding layer 220 would not be developed, and therefore, it is not necessary to remove the remained color ink 230c away from the light-shielding layer 220, and thus such a light-shielding layer 220 is not need to have the hydrophobic layer or to be hydrophobically treated.

When the color ink 230c is printed onto the substrate 210, the hydrophobic characteristic of the hydrophobic layer 220a prevents the color ink 230c from spilling out from the annular trough areas A, or mixing up between different color inks, so as to assure the quality of the color filter pattern 230.

Referring to FIG. 3B, because the outer edge position Y of the substrate 210 is configured with an undercut configuration, it is not likely to happen that the color ink 230c fails to fill up the outer edge position Y when the color ink 230c is printed to the annular trough areas A. In other words, the undercut configuration of the outer edge position Y is adapted for improving the evenness of the upper surface S2 of the color filter pattern 230.

Figure 4:
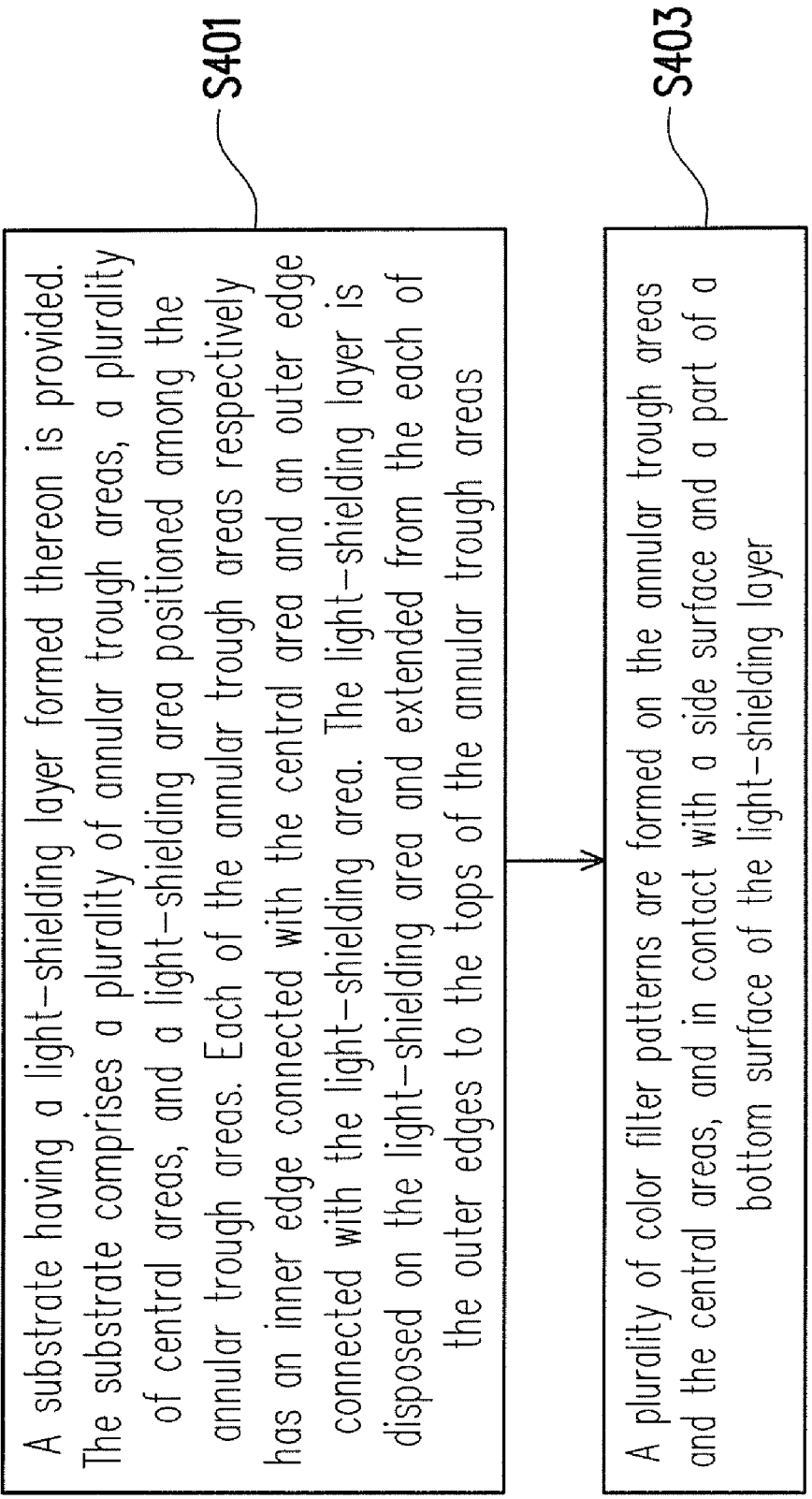
FIG. 4 is a flow chart illustrating a method of manufacturing a color filter substrate according to an embodiment of the present invention.

FIG. 4 is a flow chart illustrating a method of manufacturing a color filter substrate according to an embodiment of the present invention. Referring to FIGS. 2A, 2B, and 4, first at step S401, a substrate 210 including a light-shielding layer 220 formed thereon is provided, in which the substrate 210 includes a plurality of annular trough areas A, a plurality of central areas B, and a light-shielding area C among the annular trough areas A. Each of the annular trough areas A has an inner edge $A_X$ connected with a corresponding central area B and an outer edge $A_Y$ connected with the light-shielding area C. The light-shielding layer 220 is disposed on the light-shielding area C, and extending from the outer edges $A_Y$ to the tops of the annular trough areas A.

Figure 5C:
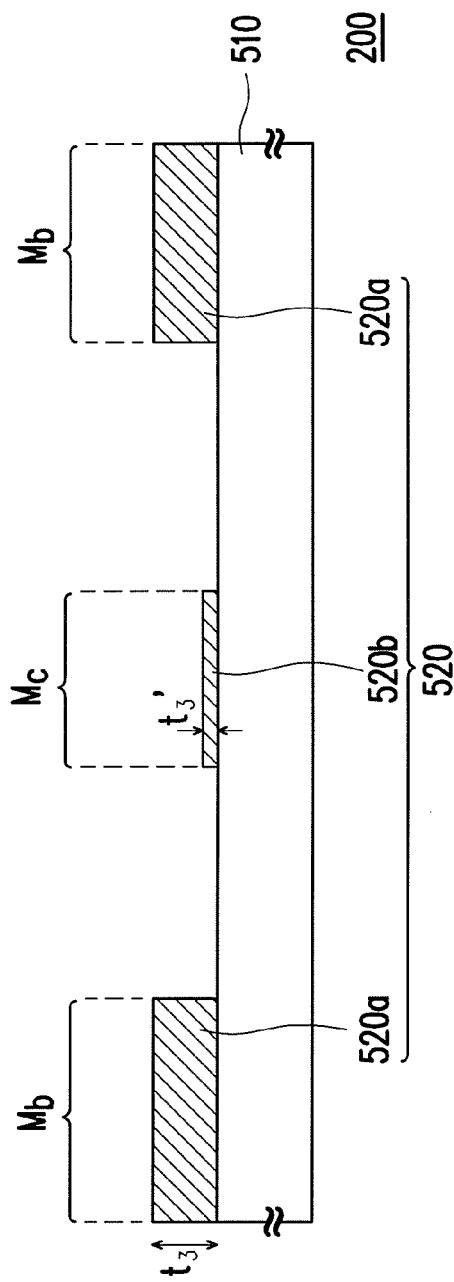

For example, the annular trough areas A can be formed by a method as following. FIGS. 5A through 5E are cross-sectional views illustrating a flow of fabricating annular trough areas according to the first embodiment of the present invention, which FIGS. 5A through 5E are cross-sectional views of FIG. 2A along line $L_1$-$L_1$'. Referring to FIG. 5A first, a base material 510 is provided. The base material 510 for example can be made of a hard or a soft transparent material, such as an inorganic transparent material (e.g., glass, quartz, or other suitable materials, or combination of the foregoing), an organic transparent material (e.g., polyolefins, polythiourea, polyalcohols, polyester, rubber, thermoplastic polymer, thermosetting polymer, polyarylene, polymethyl methacrylate, plastics, polycarbonate, or other suitable materials, or derivatives of the foregoing, or combinations of the foregoing), or a combination thereof. The base material 510 of the present invention is for example made of a glass material, but not restricted to be made of a glass material.

Then, referring to FIG. 5B, a mask material layer 520' is formed on the base material 510. Preferably, the mask material layer 520' is processed by a half tone mask (HTM). For example, the mask material layer 520' is a photosensitive material layer such as a positive photoresist. The HTM M for example includes a light transmissive region $M_a$, a light-shielding region $M_b$, and a half tone exposure region $M_c$. A light provided by a light source LS transmits through the HTM M to process a photolithography process to the mask material layer 520'. Of course, in other embodiments, the mask material layer 520' being a photosensitive material layer can also be a negative photoresist, and in this case, positions of the light transmissive region $M_a$ and the light-shielding region $M_b$ of the HTM M should be adjusted correspondingly.

Further, after the HTM process is performed to the mask material layer 520', the mask material layer 520' is patterned, and a mask layer 520 is formed on the base material 510, as shown in FIG. 5C. The mask layer 520 includes a first mask pattern 520a and a plurality of second mask patterns 520b (only one second mask pattern 520b is shown in FIG. 5C as an example). It should be noted that the first mask pattern 520a and the second mask patterns 520b correspond to the light-shielding region $M_b$ and the half tone exposure region $M_c$ of the HTM M (as shown in FIG. 5B), respectively, and therefore a thickness $t_3$' of the second mask patterns 520b is substantially smaller than a thickness $t_3$ of the first mask pattern 520a.

Figure 5D:
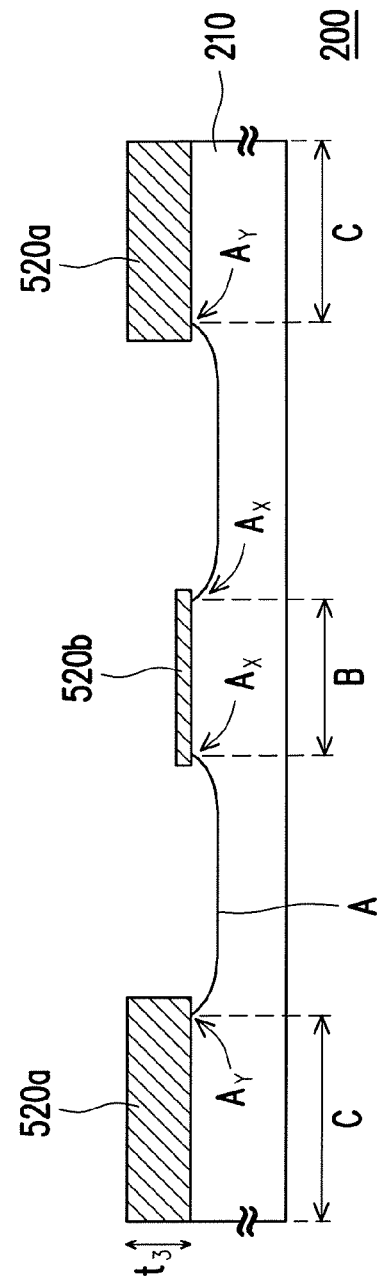

Then, referring to FIG. 5C, an etching process is performed to remove a part of the base material 510 that is not covered by the mask layer 520, and thus to configure the substrate 210 including the annular trough areas A, the light-shielding area C corresponding to the first mask pattern 520a, and the central areas B corresponding to the second mask patterns 520b, as shown in FIG. 5D. Moreover, as shown in FIGS. 2A and 5D, the light-shielding area C is positioned among the annular trough areas A, and each of the annular trough areas A includes an inner edge $A_X$ connected with a corresponding central area B and an outer edge $A_Y$ connected with the light-shielding area C.

It should be mentioned that the foregoing etching process is preferably an isotropic etching process. For example, such an isotropic etching process is performed to configure undercuts at the substrate 210 under the first mask pattern 520a and the second mask patterns 520b. In other words, the first mask pattern 520a extends from the outer edges $A_Y$ to the upside of the annular trough areas A, and the second mask patterns 520b extend from the inner edges $A_X$ to the upside of the annular trough areas A.

Figure 5E:
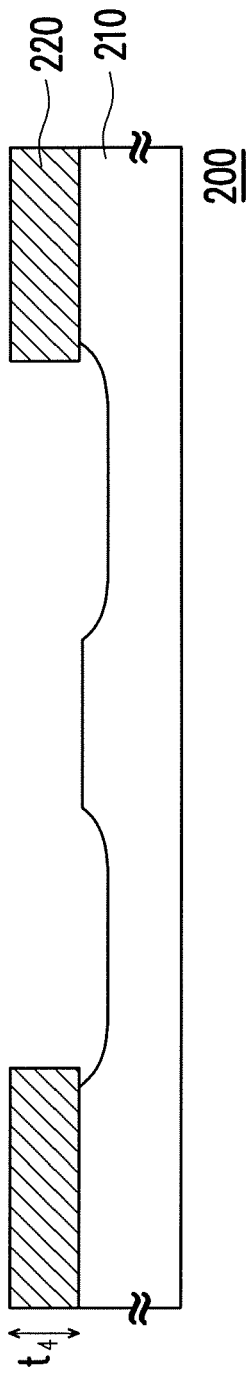

Then, as shown in FIG. 5E, the second mask patterns 520b are removed away. Specifically, in the instant embodiment, the second mask patterns 520b are preferably removed away by an ashing process. For example, the ashing process is performed by employing a gas plasma to perform an anisotropic etching process to the first mask pattern 520a and the second mask patterns 520b, to remove the second mask patterns 520b so as to form the light-shielding layer 220 extending from the outer edges $A_Y$ to the upside of the annular trough areas A. The gas plasma includes at least one of the following: oxygen-containing gas (e.g., oxygen, ozone, or other suitable gas, or combination of the foregoing), nitrogen-containing gas (e.g., nitrogen, nitrogen oxide, nitrous oxide, or other suitable gas, or combination of the foregoing), hydrogen-containing gas (e.g., hydrogen, water vapour, or other suitable gas, or combination of the foregoing), or other suitable gas, or combination of the foregoing. In the instant embodiment, the present invention involving oxygen plasma is illustrated as an example, but not restricted thereby. As such, a thickness $t_4$ of the light-shielding layer 220 as shown in FIG. 5E is substantially smaller than the thickness $t_3$ of the first mask pattern 520a of FIG. 5D. Till now, the fabrication of the substrate 210 having the light-shielding layer 220 of the instant embodiment is substantially completed.

Figure 5F:
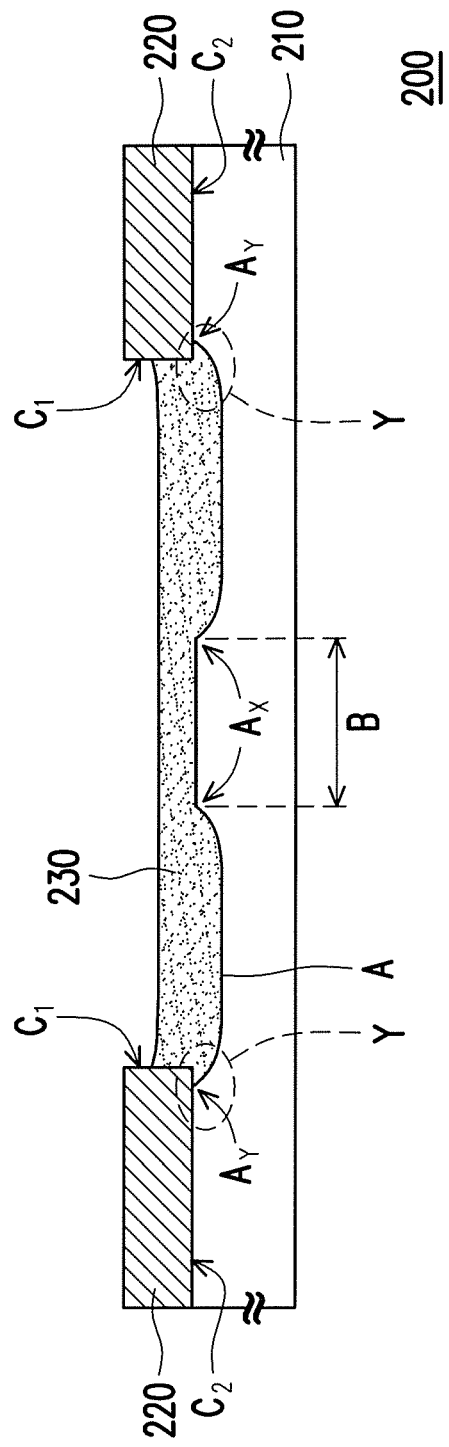
FIG. 5F is a cross-sectional view illustrating an embodiment of forming the color filter patterns according to the present invention.

Then, the subsequent steps for the color filter process are further discussed as below. FIG. 5F is a cross-sectional view illustrating an embodiment of the formation of the color filter patterns according to the present invention. Referring to FIGS. 4 and 5F, at step S403, a plurality of color filter patterns 230 are formed on the annular trough areas A and the central areas B (only one color filter pattern 230 is shown in FIG. 5F for illustration purpose). Further, because the light-shielding layer 220 extends from the outer edges $A_Y$ to the upside of the annular trough area A, the color filter pattern 230 is in contact with a side surface C1 and a part of a bottom surface C2 of the light-shielding layer 220. In other words, the undercut configuration of the substrate 210 under the light-shielding layer 220 allows the outer edge positions Y of the annular trough area A being filled up with the color filter pattern 230.

Further, the first mask pattern 520a and the second mask patterns 520b are formed by photoresist for example, but not restricted to be photoresist. Other photosensitive materials may be used, such as enzocyclobutane (BCB), cyclones, polyimide, polyaramid, polyester, polyalcohols, poly(ethylene oxide), polyphenyl, resin, polyether, polyketide, or other suitable materials, or combinations of the foregoing. Further, in other embodiments, the light-shielding layer 220 can be made of reflective materials, non-transparent materials, light absorptive materials, such as metal, metal oxide, metal nitride, metal nitride oxide, metal carbide, metal silicide, metal alloy, metal alloy nitride, metal alloy nitride oxide, metal alloy carbide, metal alloy silicide, or other suitable conductive or insulating materials, or combinations of the foregoing. In case the light-shielding layer 220 is made of reflective materials, the method for example includes: sequentially forming the reflective material layer (not shown) and the mask material layer 520' (e.g., a photoresist material layer) on the base material 510; then performing a first time photolithography process to the mask material layer 520' by the light provided by the light source LS transmitting through the HTM M, for patterning the mask material layer 520', and forming a mask layer 520 on the base material 510, in which the mask layer 520 includes a first mask pattern 520a and a plurality of second mask patterns 520b. The first mask pattern 520a corresponds to the light-shielding region $M_b$, and the second mask patterns 520b correspond to the half tone exposure region $M_c$, respectively, and therefore a thickness $t_3'$ of the second mask patterns 520b is substantially smaller than a thickness $t_3$ of the first mask pattern 520a. Then, the manufacturing method further includes: etching to remove exposed reflective material layer (not shown). The amount of the etched exposed reflective material layer (not shown) is greater than the amount of the etched reflective material layer (not shown) under the second mask patterns 520b, and therefore, the reflective material layer (not shown) corresponding to the light transmissive region $M_a$ is going to be removed so as to expose the base material 510 thereunder, while the reflective material layer (not shown) corresponding to the light-shielding region $M_b$ is protected by the first mask pattern 520a so that the reflective material layer thereunder will have a greatest thickness, and the reflective material layer (not shown) corresponding to the half tone exposure region $M_c$ is temporarily protected by the second mask patterns 520b so that the reflective material layer thereunder will have a secondly greatest thickness. Then, the manufacturing method further includes: etching the base material 510 to complete the fabrication of the embodiment, and then removing the rest of the reflective material layer corresponding to the half tone exposure region $M_c$ and the first mask pattern 520a.

Second Embodiment

The second embodiment is similar with the first embodiment as disclosed above, and the elements in common are not to be iterated hereby. Specifically, the configuration and fabrication process of the color filter patterns of the instant embodiment can be learnt by referring to FIGS. 2A, 2B, 3A, 3B, 4, and the related context. The instant embodiment differs from the first embodiment in that the annular trough areas of the color filter substrate of the instant embodiment are formed by two steps of mask processes instead of the HTM process of the first embodiment. Details of the fabrication process of the annular trough areas of the instant embodiment are to be discussed here below.

Figure 6G:
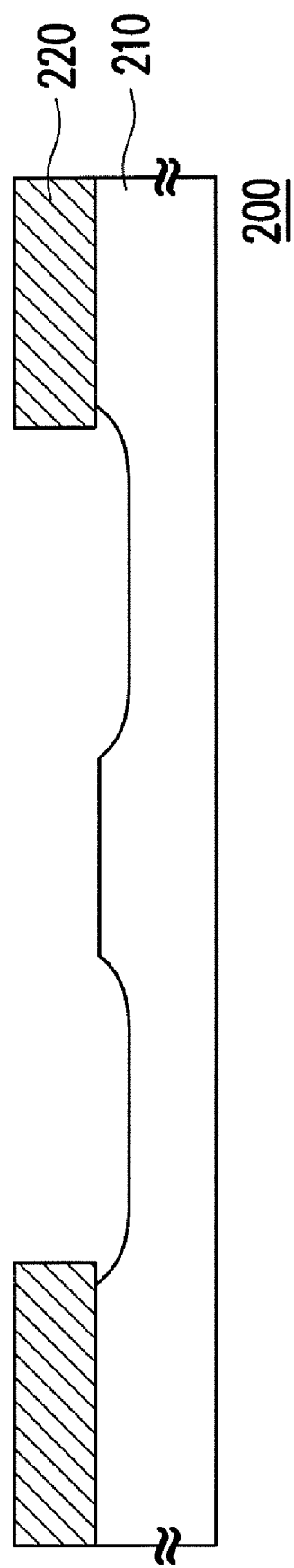

FIGS. 6A through 6G are cross-sectional views illustrating a flow of forming annular trough areas according to a second embodiment of the present invention, in which FIGS. 6A through 6G are cross-sectional views of FIG. 2A along line $L_1$-$L_1'$. Referring to FIG. 6A first, a base material 610 is provided. The base material 610 for example can be made of a hard or a soft transparent material, such as an inorganic transparent material (e.g., glass, quartz, or other suitable materials, or combination of the foregoing), an organic transparent material (e.g., polyolefins, polythiourea, polyalcohols, polyester, rubber, thermoplastic polymer, thermosetting polymer, polyarylene, polymethyl methacrylate, plastics, polycarbonate, or other suitable materials, or derivatives of the foregoing, or combinations of the foregoing), or a combination thereof. The present invention is exemplified but not restricted to be a glass material hereby.

Then, referring to FIG. 6B, the first mask material layer 620 with a thickness $t_5$ is formed on the base material 610, and the first time photolithography process P1 is performed to the first mask material layer 620. Specifically, for example, the first mask material layer 620 is preferably a positive photoresist, but not limited. In the instant embodiment, a light provided by a light source LS1 transmits through a mask M1 to perform the first photolithography process to the first mask material layer 620. The mask M1 for example includes a light transmissive region $M_a$ and a light-shielding region $M_b$. Of course, in other embodiments, the first mask material layer 620 can also be a negative photoresist, and in this case, positions of the light transmissive region $M_a$ and the light-shielding region $M_b$ of the mask M1 should be adjusted correspondingly.

Therefore, after the first time photolithograph process P1 is performed to the first mask material layer 620, the first mask material layer 620 is patterned, so that the base material 610 is configured with a first mask pattern 220, as shown in FIG. 6C. The first mask pattern 220 is namely a light-shielding layer 220.

Then, referring to FIG. 6D, a second mask material layer 630' is formed on the base material 610. The second mask material layer 630' has a thickness $t_5'$ substantially smaller than the thickness $t_5$ of the first mask pattern 220. Further, the first mask material layer 620 and the second mask material layer 630' can be made of different materials or substantially the same material. Thereafter, the second time photolithography process P2 is performed to the second mask material layer 630'. Specifically, for example, the second mask material layer 630' is preferably a positive photoresist, but not limited. In the instant embodiment, a light provided by a light source LS2 transmits through a mask M2 to perform the second photolithography process P2 to the second mask material layer 630'. The mask M2 for example includes a light transmissive region $M_a$ and a light-shielding region $M_b$. Of course, in other embodiments, the second mask material layer 630' can also be a negative photoresist, and in this case, positions of the light transmissive region $M_a$ and the light-shielding region $M_b$ of the mask M2 should be adjusted correspondingly.

Therefore, after the second time photolithograph process P2 is performed to the second mask material layer 630', the second mask material layer 630' is patterned, so that the base material 610 is configured with a plurality of second mask patterns 630, as shown in FIG. 6E (only one second mask pattern 630 is shown in FIG. 6E for illustration as an example). In this case, the first mask pattern 220 and the second mask patterns 630 configure a mask layer 640, while the thickness $t_5'$ of the second mask patterns 630 is substantially smaller than the thickness $t_5$ of the first mask pattern 220.

Then, an etching process is performed to the base material 610 to remove a part of the base material 610 that is not covered by the mask layer 640, and thus to configure the substrate 210 including the annular trough areas A, the light-shielding area C corresponding to the first mask pattern 220, and the central areas B corresponding to the second mask patterns 630, as shown in FIG. 6F. Moreover, as referring to FIGS. 2A and 6F, the light-shielding area C is positioned among the annular trough areas A, and each of the annular trough areas includes an inner edge $A_X$ connected with a corresponding central area B and an outer edge $A_Y$ connected with the light-shielding area C.

Specifically, the foregoing etching process is preferably an isotropic etching process. For example, such an isotropic etching process is performed to configure undercuts of the first mask pattern 220 (or namely light-shielding layer 220) and the second mask patterns 630 on the annular trough areas A. In other words, the first mask pattern 220 (or namely light-shielding layer 220) extends from the outer edges $A_Y$ to the upside of the annular trough areas A, and the second mask patterns 520b extend from the inner edges $A_X$ to the upside of the annular trough areas A.

Then, a photoresist removing process is performed on the substrate 210 to remove the second mask patterns 630, as shown in FIG. 6G. Till now, the fabrication of the substrate 210 having a light-shielding layer 220 of the instant embodiment according to the present invention is substantially completed.

Then, subsequent process steps to the color filter substrate 220 can be performed. The details of the subsequent process steps are similar with the first embodiment and can be learnt by referring to FIG. 5F and the related context thereof, and are not to be iterated hereby. As shown in FIG. 5F, the color filter pattern 230 is in contact with a side surface C1 of the light-shielding layer 220 and a part of a bottom surface C2 of the light-shielding layer 220, so that the outer edge positions Y of the annular trough area A can be filled up with the color filter pattern 230.

In the instant embodiment, the light-shielding layer 220 and the second mask patterns 630 can be made of photosensitive materials, such as, photoresist materials, enzocyclobutane (BCB), cyclones, polyimide, polyaramid, polyester, polyalcohols, poly(ethylene oxide), polyphenyl, resin, polyether, polyketide, or other suitable materials, or combinations of the foregoing, and are exemplified as but not restricted to be made of photoresist materials. Further, in other embodiments, at least one of the light-shielding layer 220 and the second mask patterns 630 can be made of a reflective material, a non-transparent material, or a light absorptive material, such as metal, metal oxide, metal nitride, metal nitride oxide, metal carbide, metal silicide, metal alloy, metal alloy nitride, metal alloy nitride oxide, metal alloy carbide, metal alloy silicide, or other suitable conductive or insulating materials, or combinations of the foregoing. As such with respect to the other embodiment for example, the manufacturing method for example includes the following descriptions. The reflective material layer (not shown) and the first mask material layer 620 are sequentially formed on the base material 610. Then a first time photolithography process P1 is performed to the first mask material layer 620 by the light provided by the light source LS1 transmitting through the mask M1 to expose a part of the reflective material layer (not shown) from the first mask material layer 620. An etching process is performed to remove the exposed reflective material layer (not shown). After that, remove the first mask material layer 620 to obtain a reflective material pattern layer serving as the light-shielding layer 220, which exposes a part of the base material 610 as shown in FIG. 6C. The second mask patterns 630 can be fabricated in accordance with the second embodiment of other embodiments. With respect to the other embodiments, for example, a method for fabricating the second mask patterns 630 for example includes the following descriptions. Another reflective material layer (not shown) and the second mask material layer 630' are sequentially formed on the base material 610 for covering the light-shielding layer 220 and the base material 610. Then, a second time photolithography process P2 is performed to the second mask material layer 630' by the light provided by the light source LS2 transmitting through the mask M2 to expose a part of another reflective material layer (not shown) from the second mask material layer 630'. An etching process is performed to remove the exposed another reflective material layer (not shown). After that, remove the second mask material layer 630' and thus obtain the reflective material pattern layer (i.e., the second mask patterns 630), which exposes the substrate 210 and the light-shielding layer 220, as shown in FIG. 6F. Specifically, a thickness of the reflective material layer (not shown) is substantially greater than a thickness of another reflective material layer. The reflective material layer (not shown) and another reflective material can be made of a same material or different materials. The subsequent process steps can be learnt by referring to FIG. 6G, and are not to be iterated hereby.

Figure 7A:
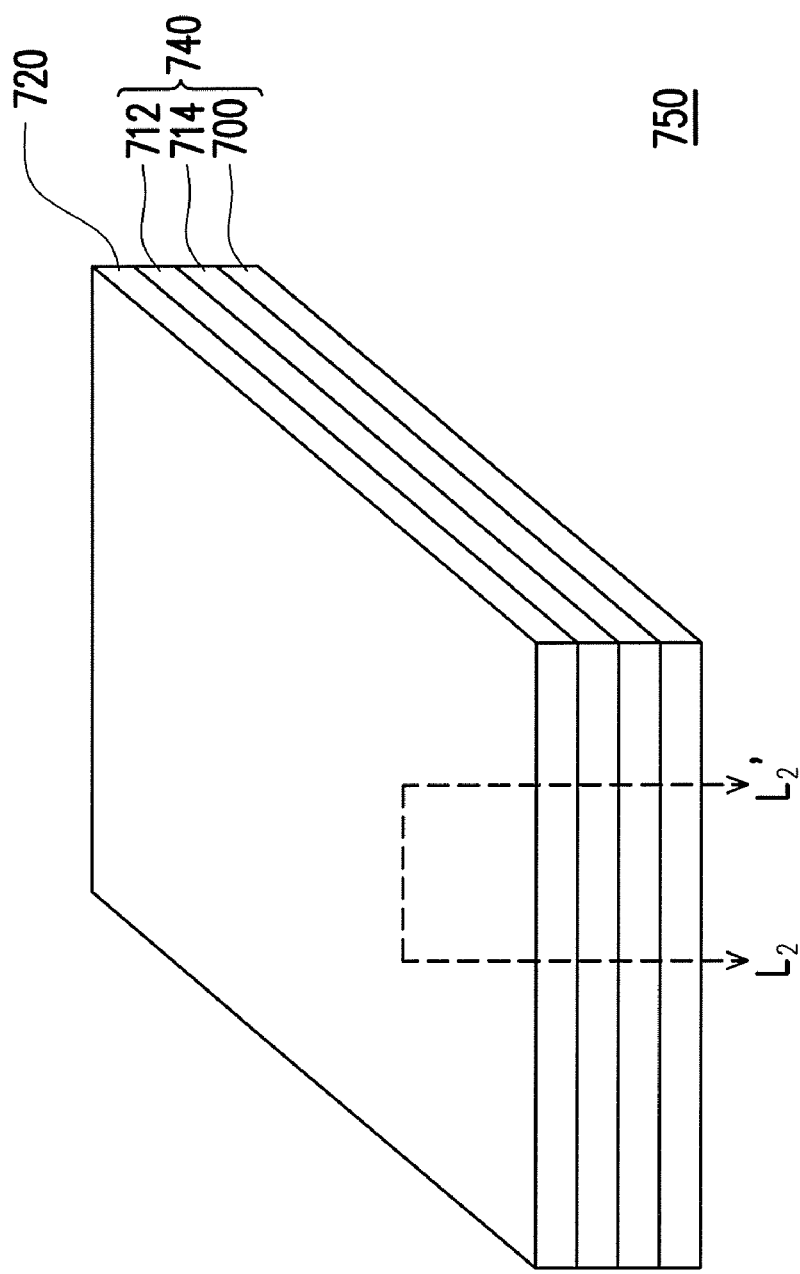
FIG. 7A is a top view of a display including a color filter substrate according to an embodiment of the present invention.

FIG. 7A is a top view of a display including a color filter substrate according to an embodiment of the present invention. Referring to FIG. 7A, it shows a display 750 including a display panel 740 and a backlight module 720. The display panel 740 is mainly constituted by a color filter substrate 700, a pixel array substrate 712 disposed opposite to the color filter substrate 700, and a display medium 714 disposed between the color filter substrate 700 and the pixel array substrate 712.

Figure 7B:
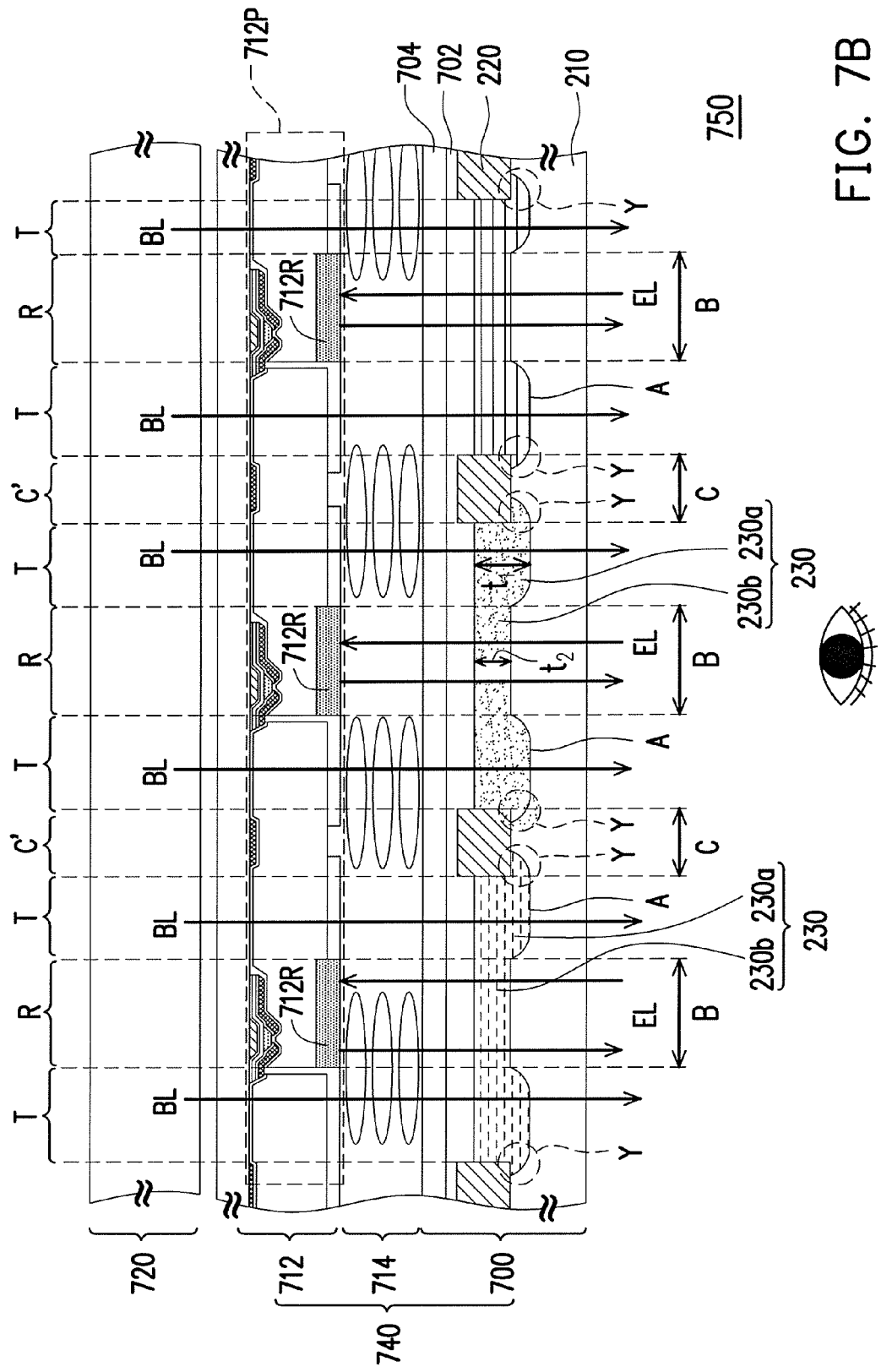
FIG. 7B is a cross-sectional view of FIG. 7A along line $L_2$-$L_2'$.

FIG. 7B is a cross-sectional view of FIG. 7A along line $L_2$-$L_2'$. Referring to FIG. 7B, in the instant embodiment, besides the aforementioned elements of the color filter substrate 200 (related description for the elements is not to be iterated hereby), the color filter substrate 700 further includes at least one of an overcoat layer 702 and a transparent electrode 704. In the instant embodiment, the present invention is exemplified as including both of the overcoat layer 702 and the transparent electrode 704 for example. In the instant embodiment, the overcoat layer 702 and the transparent electrode 704 cover the annular trough areas A, the central areas B, and the light-shielding area C. Further, the pixel array substrate 712 may include a pixel array 712P and a peripheral circuit (not shown) connected to the pixel array 712P. The pixel array 712P may include transmissive display regions T corresponding to the annular trough areas A, reflective display regions R corresponding to the central areas B, and an opposite light-shielding area C' corresponding to the light-shielding area C, respectively.

Further, the peripheral circuit (not shown) is adapted for driving the pixel array 712P, so as to allow a backlight BL provided by the backlight module 720 transmitting through the transmissive display regions T for displaying images, and to allow an ambient light EL' being reflected by a reflective electrode 712R disposed in the reflective display regions R for displaying images. For the purpose of achieving harmony between images displayed by lights corresponding to the light transmissive region T and the reflective region R, respectively, in the instant embodiment, the thickness $t_1$ of the first pattern 230a of the color filter patterns 230 is preferred but not restricted to be substantially two times of the thickness $t_2$ of the second patterns 230b of the color filter patterns 230. The thicknesses of the first pattern 230a and the second patterns 230b can also be the same as discussed in the first embodiment. It should be noted that, the display medium 714 is for example a light modulated material, such as liquid crystal material. However, the display medium 714 is not restricted to be a light modulated material. In other embodiments, the display medium 714 can be self-luminescent material, such as an organic material, an inorganic material, or a combination thereof, and the display 750 may be not used the backlight BL. In another embodiment, the display medium 714 can adopt a light modulated material and a self-luminescent material together, and the display 750 may be not used the backlight BL. Further, FIG. 7B discloses a thin film transistor (TFT) (not labelled) structure, taking a bottom-gate TFT as an example. However, the TFT is not restricted to be a bottom-gate TFT, while top-gate TFT or other suitable TFT modes can also be used thereby. Generally, a bottom-gate TFT includes a gate, an insulating layer covering the gate, a semiconductor layer formed on the insulating layer, a source, and a drain. The source and the drain are formed on the semiconductor layer respectively and separated one from another. A top-gate TFT includes a semiconductor layer, an insulating layer covering the semiconductor layer, a gate formed on the insulating layer, an inner insulating layer covering the gate and the insulating layer, a source, and a drain. The source and the drain are respectively formed on a part of the inner insulating layer and connected to the semiconductor layer, and the source and the drain are separated one from another. In other embodiments, conductive layers of the TFT may be used to instead of the reflective electrode 712R. For example, the source/drain, data lines, or upper/bottom electrodes of a storage capacitor. The conductive materials having a reflective characteristic may be capable of reflecting lights to form micro-reflective regions, which are functionally equivalent to the reflective electrode 712R of the instant embodiment.

As shown in FIG. 7B, the substrate 210 under the light-shielding layer 220 is configured with an undercut, and therefore the color filter patterns 230 can fill up the inner edge positions X of the annular trough areas A. As such, the upper surface S2 of the color filter patterns 230 can be configured relatively even, so that the display 750 can display images with improved optical performance. Further, the light-shielding region C which usually corresponding to the opposite light-shielding region C' for example defines circuits of pixel regions (not labelled). The circuits include gate lines and data lines. However, sometimes in accordance with specific design, the light-shielding region C may also corresponds to alignment elements of the pixel regions, such as, protrusions, slits, or combinations of the foregoing.

Third Embodiment

The third embodiment is similar with the first embodiment as disclosed above, and the elements in common are not to be iterated hereby. Specifically, the configuration and fabrication process of the color filter patterns of the instant embodiment can be learnt by referring to FIGS. 2A, and 4, and the related context thereof. The instant embodiment differs from the first embodiment in that the color filter substrate of the instant embodiment further includes a plurality of reflective layers, and a plurality of linear layers. The configuration and the fabrication process of the color filter substrate of the instant embodiment are to be discussed herebelow.

Figure 8:
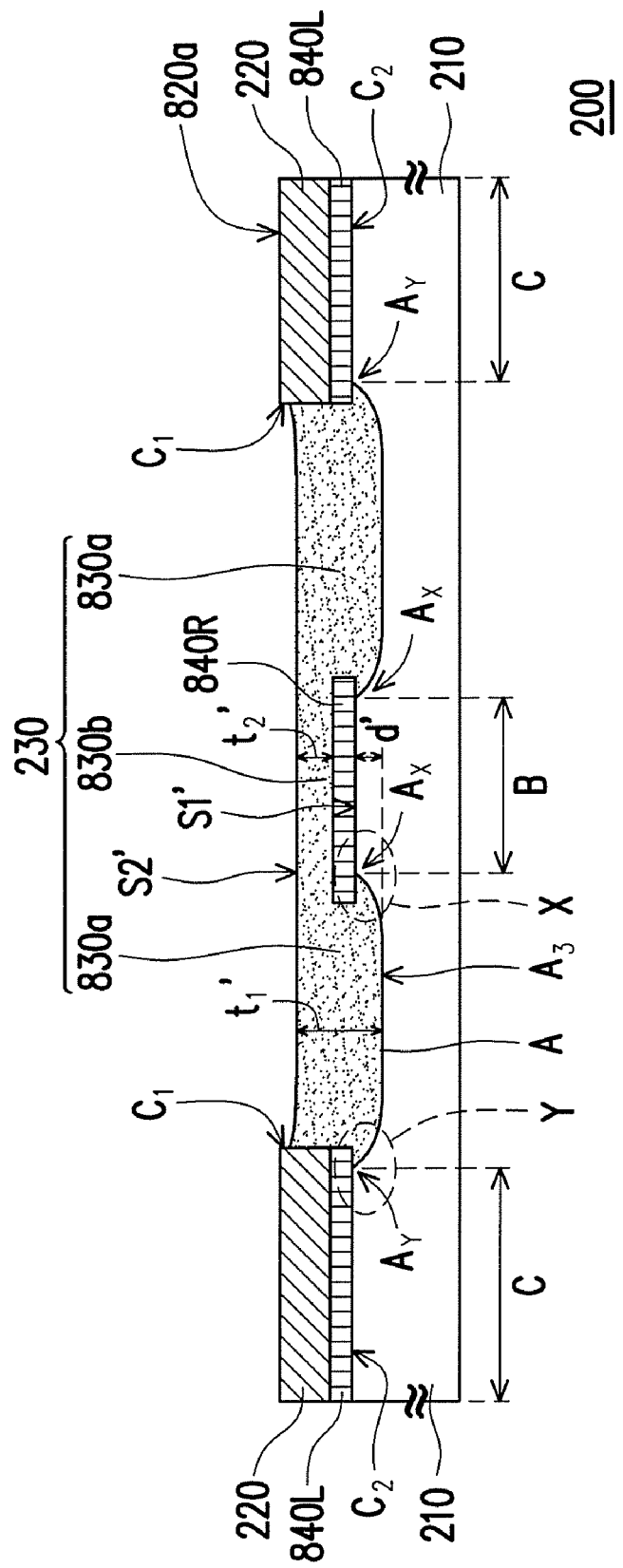
FIG. 8 is a cross-sectional view of FIG. 2A along line $L_3$-$L_3'$.

FIG. 8 is a cross-sectional view of FIG. 2A along line $L_3$-$L_3'$, in which only one color filter pattern 230 and only one annular trough area A are illustrated. Referring to FIG. 8, the central area B and the light-shielding area C of the substrate 210 are preferably positioned at a same plane S1' for example. The annular trough area A is configured with an inner edge $A_X$ and an outer edge $A_Y$. The inner edge $A_X$ is connected with the central area B, and the outer edge $A_Y$ is connected with the light-shielding area C. Further, the light-shielding layer 220 is disposed on the light-shielding area C, and extending from the outer edge $A_Y$ to top of the annular trough area A. The color filter pattern 230 is disposed on the annular trough area A and the central area B, and in contact with a side surface C1 and a part of bottom surface C2 of the light-shielding layer 220. Specifically, the light-shielding layer 220 does not entirely cover the color filter pattern 230.

Further, the color filter substrate 200 of the instant embodiment further includes a plurality of reflective layers 840R and a plurality of liner layers 840L (only one reflective layer 840R shown in FIG. 8). The reflective layers 840R are disposed on the central areas B, and the liner layers 840L are disposed between the light-shielding layer 220 and the substrate 210. Furthermore, the reflective layers 840R extend from the inner edge $A_X$ to the tops of the annular trough areas A. In other words, the substrate 210 under the light-shielding layer 220 and the reflective layers 840R is configured with an undercut.

As shown in FIG. 8, in the instant embodiment, each annular trough area A includes a bottom A3, for example an even bottom or an uneven bottom. The present invention prefers but is not restricted to include an even bottom A3. A depth of the annular trough area A measured from the even bottom A3 is defined as a maximum depth d'. The maximum depth d' for example is about 1 micron. The depth value of the maximum depth d' can be an average of values measured from multi-points or a value measured from a single point. Further, the depth of the annular trough area A gradually decreases when approaching to the inner edge position X and the outer edge position Y.

Referring to FIG. 8, in the instant embodiment, the color filter pattern 230 is preferred but not restricted to include a substantially even upper surface S2'. In other embodiments, the color filter pattern 230 may also include an uneven upper surface. Further each color filter pattern 230 includes the first pattern 830a and the second pattern 830b. The first pattern 830a is disposed on the annular trough area A, while the second patter 830b is disposed on the central area B. A thickness $t_1$' of the first pattern 830a is preferred but not restricted to be two times of the thickness $t_2$' of the second pattern 830b. In other embodiments, the thickness $t_1$' of the first pattern 830a for example can be other multiples (e.g., a natural number greater than 0) of the thickness $t_2$' of the second patter 830b, in which the thickness $t_1$' is substantially greater than the thickness $t_2$'.

In the instant embodiment, the light-shielding layer 220 further includes a hydrophobic layer 820a having a hydrophobic characteristic. In other embodiments, the hydrophobic layer 820a is preferably a black matrix layer having a hydrophobically treated surface. Or otherwise, the light-shielding layer 220 obtains the hydrophobic characteristic by other processes. The present invention does not restrict the light-shielding layer 220 to obtain the hydrophobic characteristic by the foregoing processes.

Figure 8A:
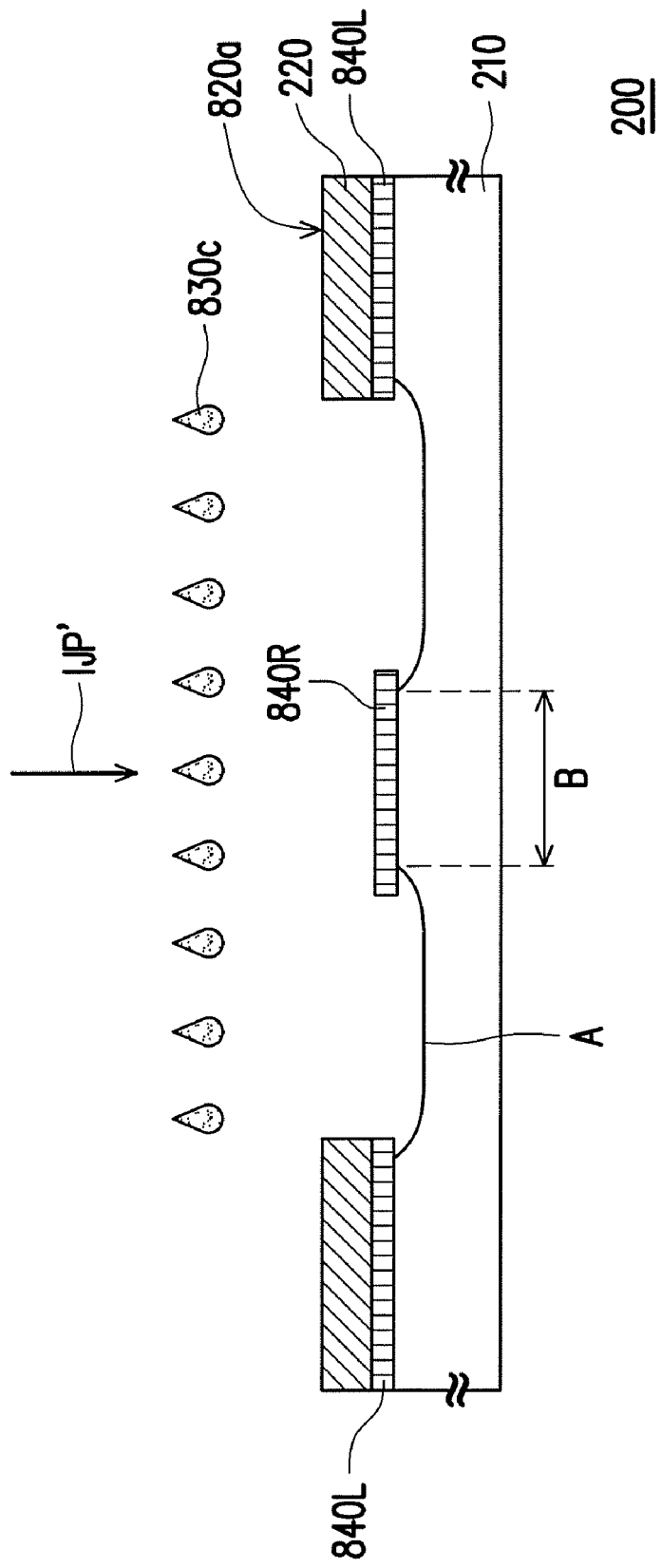
FIGS. 8A and 8B are schematic cross-sectional views illustrating a flow of forming color filter patterns with an ink-jet printing process according to another embodiment of the present invention.
Figure 8B:
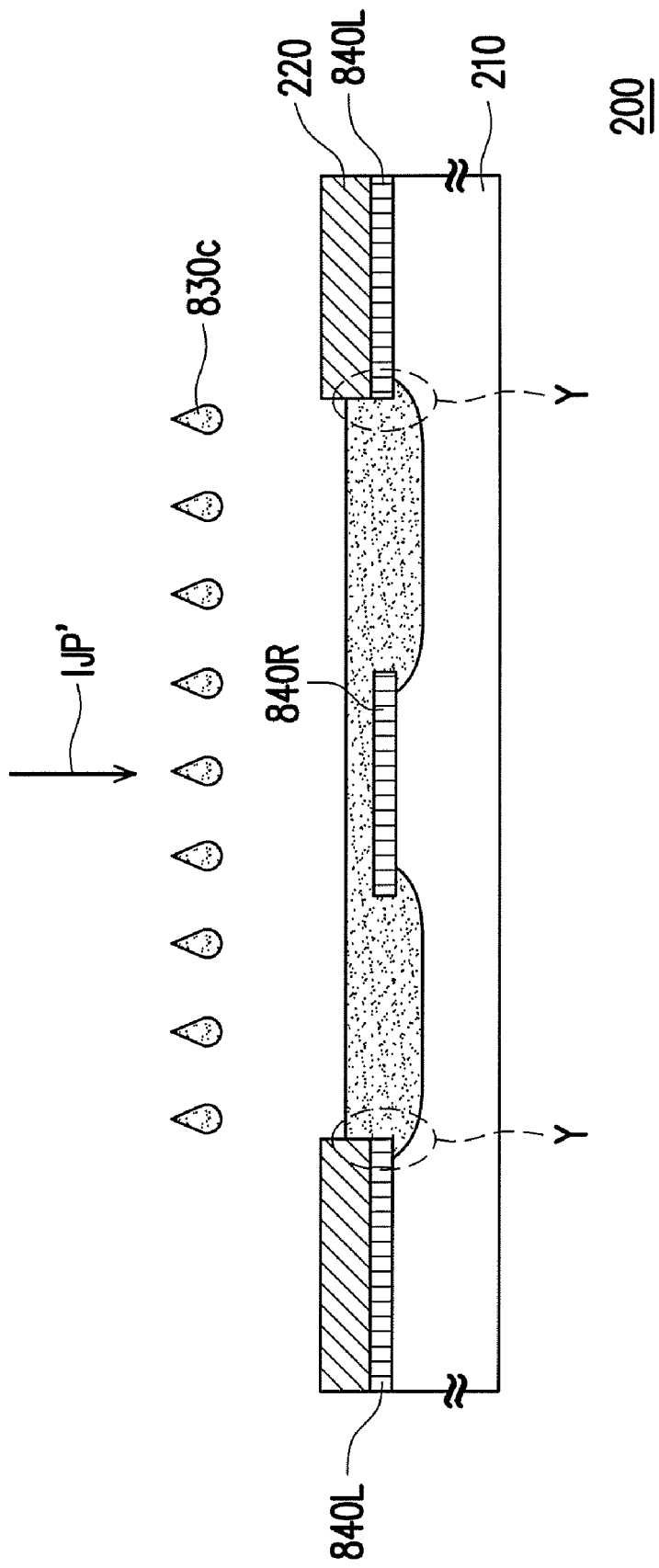

Specifically, the instant embodiment for example employs an ink-jet printing (IJP) process for printing color ink onto the substrate 210 to configure the foregoing color filter patterns 230. FIGS. 8A and 8B are schematic cross-sectional views illustrating a flow of forming color filter patterns with an ink-jet printing process according to another embodiment of the present invention. The fabrication process of forming the color filter pattern 230 of the instant embodiment is similar with that of the first embodiment as disclosed above, and the elements in common are not to be iterated hereby. The instant embodiment differs from the first embodiment in that the color filter substrate 200 of the instant embodiment further includes reflective layers 840R and liner layers 840L. The reflective layers 840R are disposed on the central areas B, and the liner layers 840L are disposed between the light-shielding layer 220 and the substrate 210. The IJP' process of FIGS. 8A and 8B can be learnt by referring to FIGS. 2A and 2B and the related context, in which same or similar numerals represent same or similar elements.

Briefly, referring to FIGS. 2A, 8A, and 8B together, when color ink 830c is ink-jet printed onto the substrate 210, the hydrophobic characteristic of the hydrophobic layer 820a prevents the color ink 830c from spilling out from the annular trough area A, or improves the phenomenon of mixing up between color ink 830c of different colors, so as to further improve the quality of the color filter pattern 230. Further, the undercut of the substrate 210 adjacent to the outer edge position Y is adapted to effectively solve the problem that the outer edge position Y cannot be filled up with the color ink 830c. Further, in other embodiments, the color ink 230c remained on the light-shielding layer 220 would not be developed, and therefore, it is not necessary to remove the remained color ink 230c away from the light-shielding layer 220, and thus such a light-shielding layer 220 does not need to have the hydrophobic layer or to be hydrophobically processed.

A flow of the method of manufacturing the color filter substrate 200 is going to be illustrated below. Referring to FIGS. 2A, 8, and 4, first at step S401, a substrate 210 including a light-shielding layer 220 formed thereon is provided, in which the substrate 210 includes a plurality of annular trough areas A, a plurality of central areas B, and a light-shielding area C among the annular trough areas A. Each of the annular trough areas A includes an inner edge $A_X$ connected with a corresponding central area B and an outer edge $A_Y$ connected with the light-shielding area C. The light-shielding layer 220 is disposed on the light-shielding areas C, and extending from the outer edges $A_Y$ to tops of the annular trough areas A.

Figure 9A:
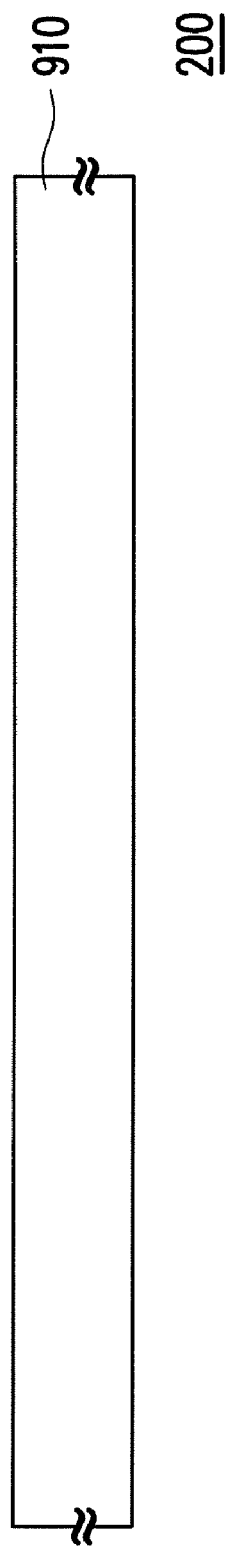
FIGS. 9A through 9F are cross-sectional views illustrating a flow of forming annular trough areas according to a third embodiment of the present invention.

The annular trough areas A are for example formed with a method as following. FIGS. 9A through 9F are cross-sectional views illustrating a flow of forming annular trough areas according to the third embodiment of the present invention. Referring to FIG. 9A, first a base material 910 is provided. The base material 910 is for example made of a hard or a soft transparent material, such as an inorganic transparent material (e.g., glass, quartz, or other suitable materials, or combination of the foregoing), an organic transparent material (e.g., polyolefins, polythiourea, polyalcohols, polyester, rubber, thermoplastic polymer, thermosetting polymer, polyarylene, poly methyl methacrylate, plastics, polycarbonate, or other suitable materials, or derivatives of the foregoing, or combinations of the foregoing), or a combination thereof. The base material 910 of the present invention is for example made of a glass material, but not restricted to be made of a glass material.

Figure 9B:
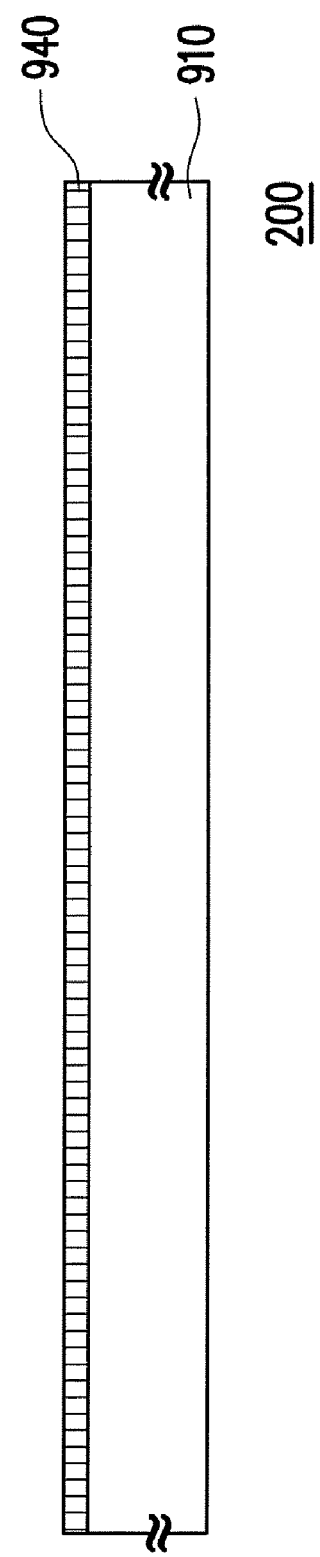

Further, referring to FIG. 9B, a reflective material layer 940 is formed on the base material 910. The reflective material layer 940 for example is made of metal, metal oxide, metal nitride, metal nitride oxide, metal carbide, metal silicide, metal alloy, metal alloy nitride, metal alloy nitride oxide, metal alloy carbide, metal alloy silicide, or other suitable conductive or insulating materials, or combinations of the foregoing.

Figure 9C:
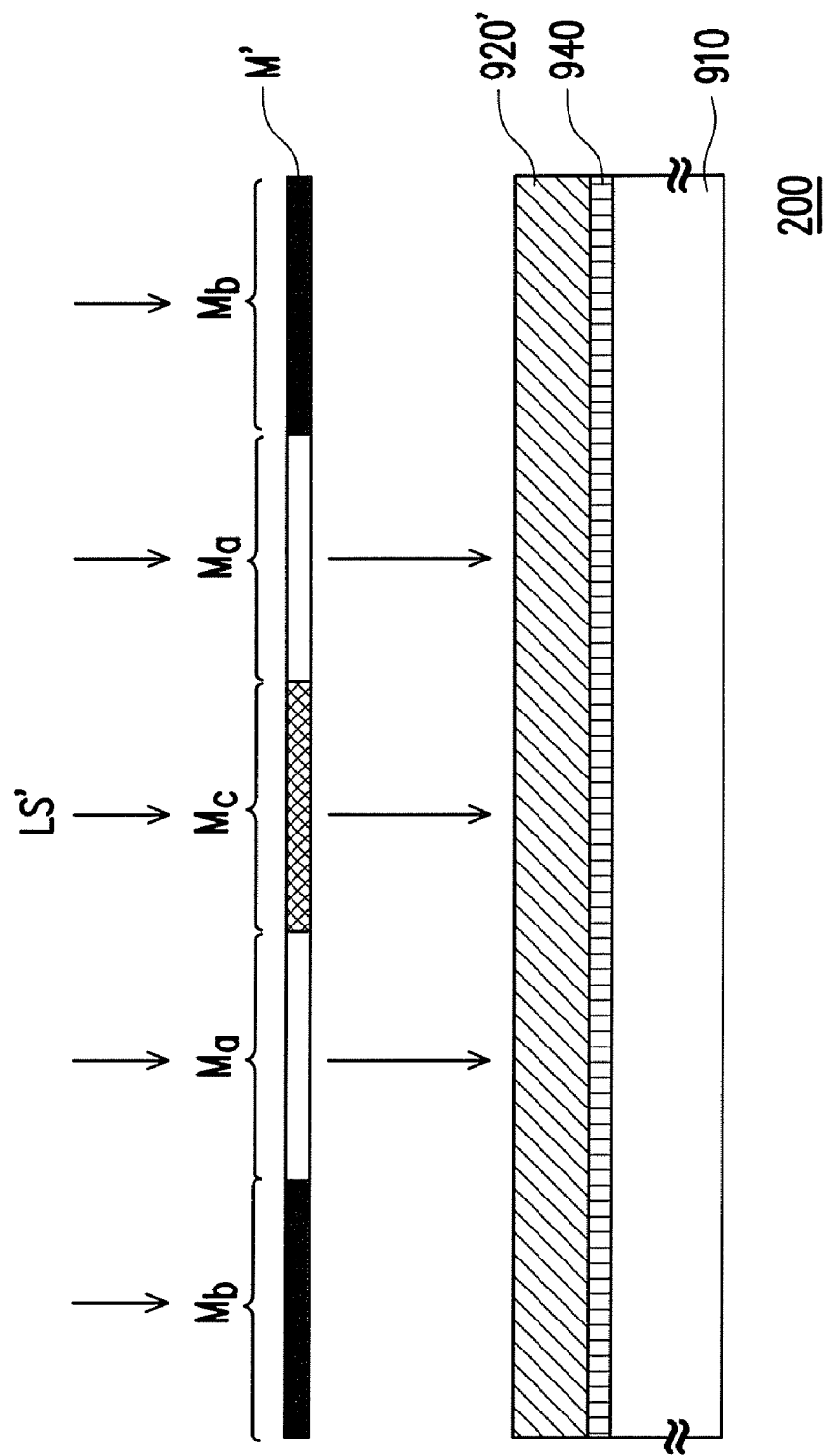

Then, referring to FIG. 9C, a mask material layer 920' is formed on the reflective material layer 940. Preferably, the mask material layer 920' is processed by a half tone mask (HTM) M'. For example, the mask material layer 920' is a photosensitive material, e.g., a positive photoresist. The HTM M' includes a light transmissive region $M_a$, a light-shielding region $M_b$, and a half tone exposure region $M_c$. A light provided by a light source LS' transmits through the HTM M' to process a photolithography process to the mask material layer 920'. Of course, in other embodiments, the mask material layer 920' can also be a negative photoresist, and in this case, positions of the light transmissive region $M_a$ and the light-shielding region $M_b$ of the HTM M' should be adjusted correspondingly.

Figure 9D:
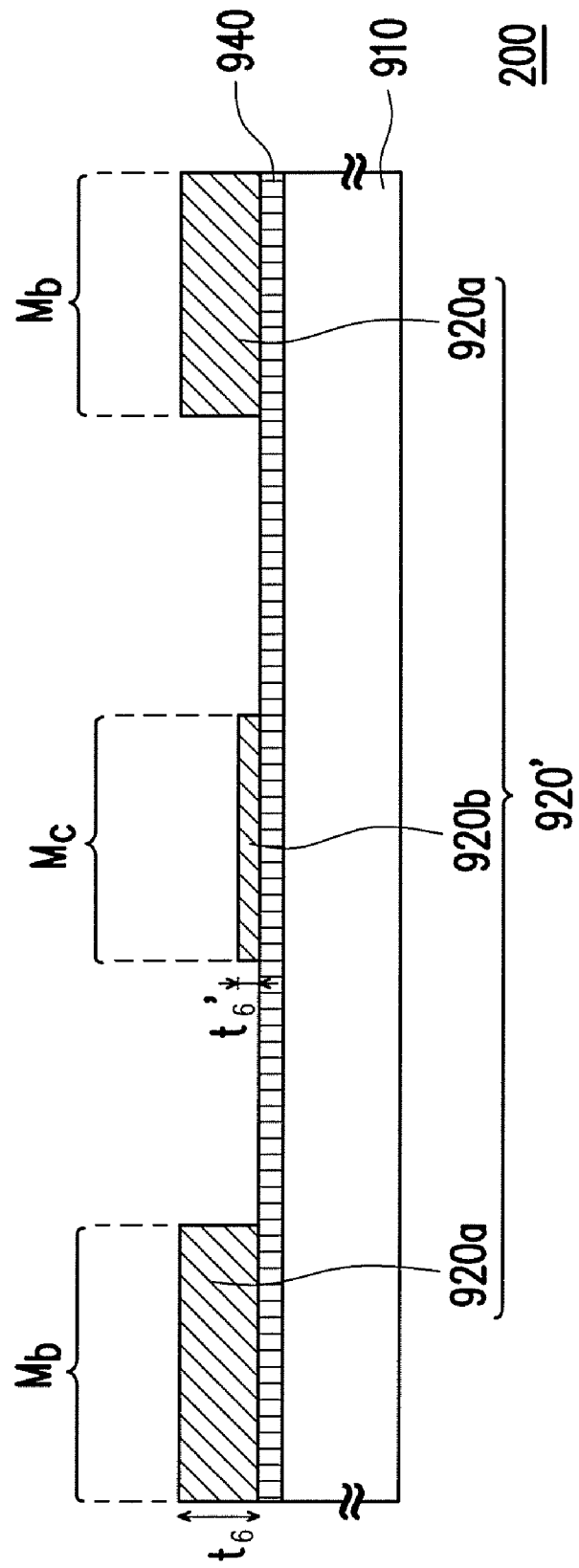

Further, after performing the HTM process to the mask material layer 920', the mask material layer 920' is patterned, and a mask layer 920 is formed on the base material 910, as shown in FIG. 9D. The mask layer 920 includes the first mask pattern 920a and a plurality of the second mask patterns 920b (only one second mask pattern 920b is shown in FIG. 9D). It should be noted that the first mask pattern 920a and the second mask patterns 920b correspond to the light-shielding region $M_b$ and the half tone exposure region $M_c$ of the HTM M' (as shown in FIG. 9C), respectively, and therefore the thickness $t_6'$ of the second mask patterns 920b is substantially smaller than the thickness $t_6$ of the first mask pattern 920a.

Figure 9E:
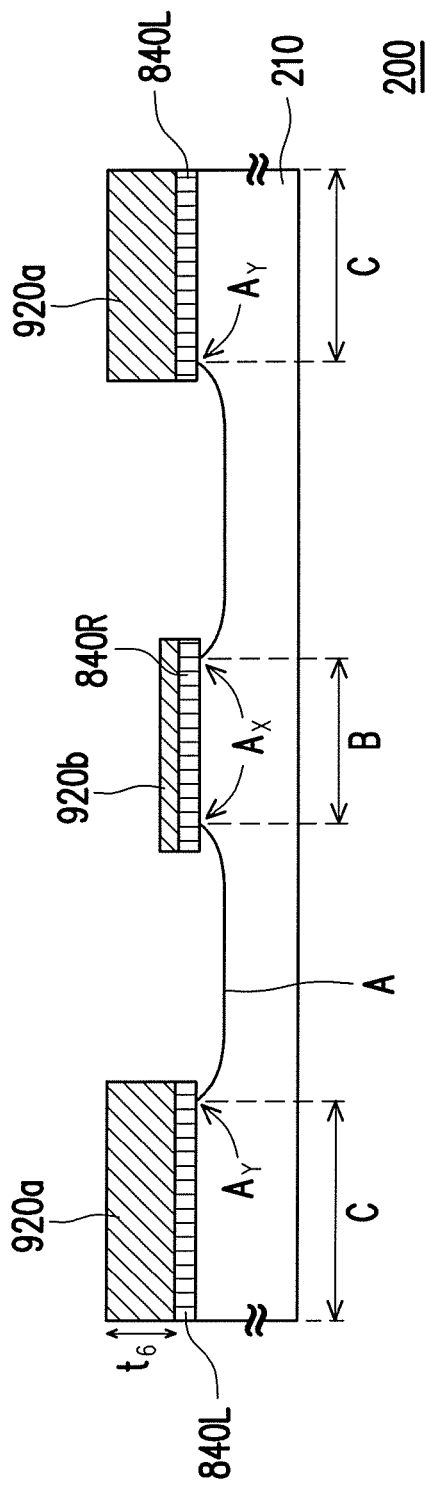

Then, referring to FIG. 9D, an etching process is performed to the reflective material layer 940 and the base material 910 to remove parts of the reflective material layer 940 and the base material 910 which are not covered by the mask layer 920, and thus forming the substrate 210 including the annular trough areas A, the light-shielding area C corresponding to the first mask pattern 920a, and the central areas B corresponding to the second mask patterns 920b, the reflective layers 840R and the liner layers 840L, as shown in FIG. 9E. The reflective layers 840R are disposed on the central areas B, and the liner layers 840L are disposed between the first mask pattern 920a and the substrate 210. Referring to FIGS. 2A and 9E, the light-shielding area C is positioned among the annular trough areas A, and each of the annular trough areas includes an inner edge $A_X$ connected with a corresponding central area B and an outer edge $A_Y$ connected with the light-shielding area C.

It should be mentioned that the foregoing etching process is preferably an isotropic etching process. For example, such an isotropic etching process is performed to configure undercuts at the substrate 210 under the first mask pattern 920a and the liner layers 840L. Similarly, undercuts are also configured at the substrate 210 under the second mask patterns 920b and the reflective layers 840R. In other words, the first mask pattern 920a and the liner layers 840L extend from the outer edges $A_Y$ to the upside of the annular trough areas A, and the second mask patterns 920b and the reflective layers 840R extend from the inner edges $A_X$ to the upside of the annular trough areas A.

Figure 9F:
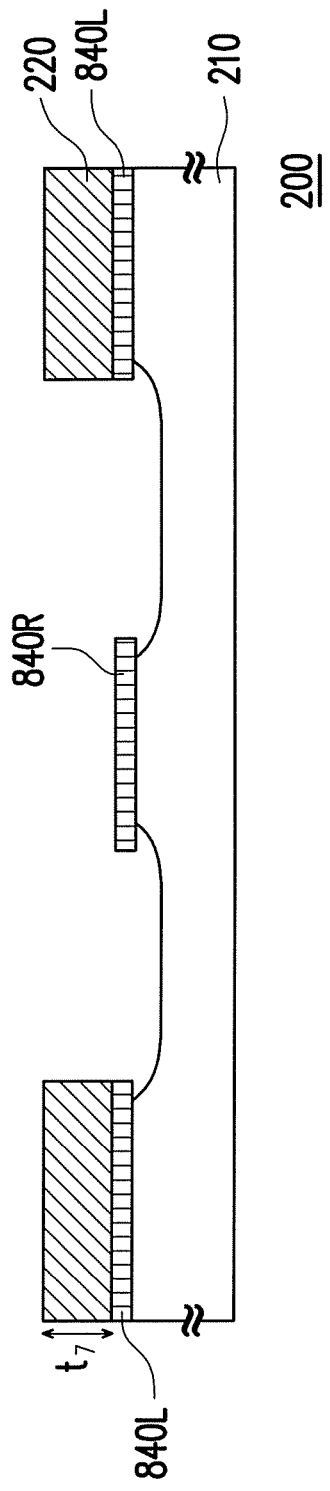

Then, the second mask patterns 920b are removed away. Specifically, in the instant embodiment, the second mask patterns 920b are preferably removed away by an ashing process. For example, the ashing process is performed by employing a gas plasma to perform an anisotropic etching process to the first mask pattern 920a and the second mask patterns 920b to remove the second mask patterns 920b so as to form the light-shielding layer 220 extending from the outer edge $A_Y$ to the upside of the annular trough area A, as shown in FIG. 9F. The gas plasma includes at least one of the following: oxygen-containing gas (e.g., oxygen, ozone, or other suitable gas, or combination of the foregoing), nitrogen-containing gas (e.g., nitrogen, nitrogen oxide, nitrous oxide, or other suitable gas, or combination of the foregoing), hydrogen-containing gas (e.g., hydrogen, water vapour, or other suitable gas, or combination of the foregoing), or other suitable gas, or combination of the foregoing. In the instant embodiment, the present invention is illustrated taking oxygen plasma as an example, but not restricted thereby. As such, the thickness $t_7$ of the light-shielding layer 220 as shown in FIG. 9F is substantially smaller than the thickness $t_6$ of the first mask pattern 920a of FIG. 9E. Till now, the fabrication of the substrate having a light-shielding layer 220 of the instant embodiment according to the present invention is substantially completed.

Then, subsequent process steps to be performed to the color filter substrate 200 are similar to the first embodiment and can be learnt by referring to the step S403 of FIG. 4 in view of FIG. 5F, and are not to be iterated hereby. As shown in 5F, the color filter pattern 230 is in contact with a side surface C1 and a part of a bottom surface C2 of the light-shielding layer 220. In other words, the undercut configuration of the substrate 210 under the light-shielding layer 220 allows the outer edge positions Y of the annular trough areas A being filled up with the color filter patterns 230.

Although the mask layer 920 of the instant embodiment is illustrated as made of a photosensitive material for example, the mask layer 920 can also be made of reflective materials, non-transparent materials, light absorptive materials, such as metal, metal oxide, metal nitride, metal nitride oxide, metal carbide, metal silicide, metal alloy, metal alloy nitride, metal alloy nitride oxide, metal alloy carbide, metal alloy silicide, or other suitable conductive or insulating materials, or combinations of the foregoing. Details of the application can be learnt by referring to the discussion related to the first embodiment.

Furthermore, the method of manufacturing the instant embodiment and the configuration obtained therefrom can also be applied to the foregoing embodiments of FIGS. 7A and 7B, or other suitable configurations.

Fourth Embodiment

The fourth embodiment is similar with the third embodiment as disclosed above, and the elements in common are not to be iterated hereby. Specifically, the configuration and fabrication process of the color filter patterns of the instant embodiment can be learnt by referring to FIGS. 2A, 8, 8A, 8B, and 4, and the related context thereof of the third embodiment. The instant embodiment differs from the third embodiment in that the annular trough areas of the color filter substrate of the instant embodiment are formed by two steps of mask processes in stead of the HTM process of the third embodiment. Details of the fabrication process of the annular trough areas of the instant embodiment are to be discussed here below.

Figure 10A:
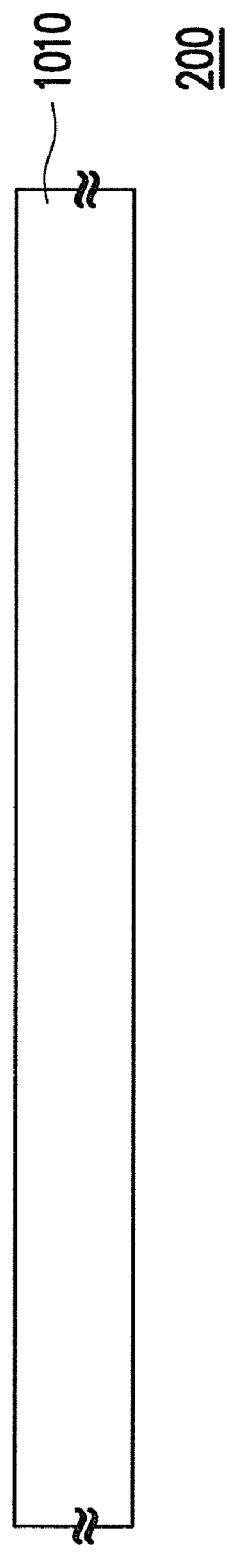
FIGS. 10A through 10H are cross-sectional views illustrating a flow of fabricating annular trough areas according to a fourth embodiment of the present invention.

FIGS. 10A through 10H are cross-sectional views illustrating a flow of fabricating annular trough areas according to a fourth embodiment of the present invention, in which FIGS. 10A through 10H are cross-sectional views of FIG. 2A along line $L_3$-$L_3'$. Referring to FIG. 10A first, a base material 1010 is provided. The base material 1010 for example can be made of a hard, or a soft transparent material, such as an inorganic transparent material (e.g., glass, quartz, or other suitable materials, or combination of the foregoing), an organic transparent material (e.g., polyolefins, polythiourea, polyalcohols, polyester, rubber, thermoplastic polymer, thermosetting polymer, polyarylene, poly methyl methacrylate, plastics, polycarbonate, or other suitable materials, or derivatives of the foregoing, or combinations of the foregoing), or a combination thereof. The present invention is exemplified but not restricted to be a glass material hereby.

Figure 10B:
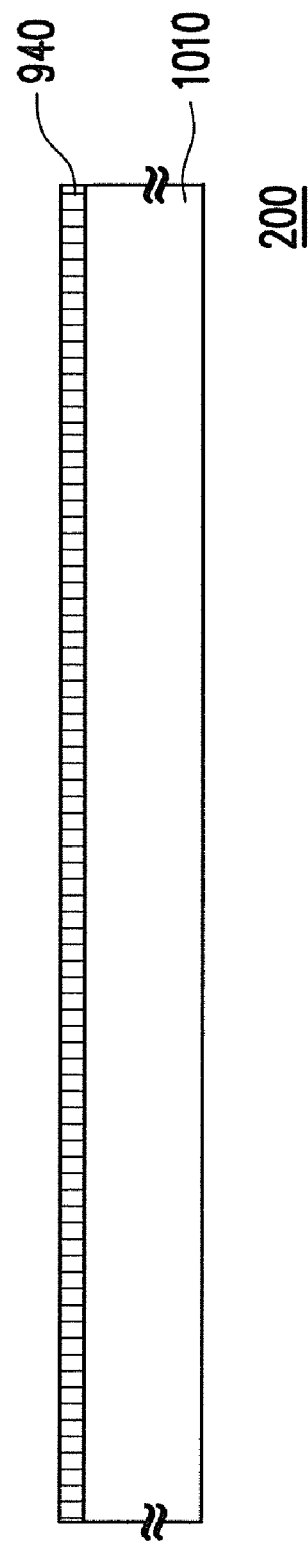

Then, referring to FIG. 10B, a reflective material layer 940 is formed on the base material 1010. The reflective material layer 940 for example is made of metal, metal oxide, metal nitride, metal nitride oxide, metal carbide, metal silicide, metal alloy, metal alloy nitride, metal alloy nitride oxide, metal alloy carbide, metal alloy silicide, or other suitable conductive or insulating materials, or combinations of the foregoing.

Figure 10C:
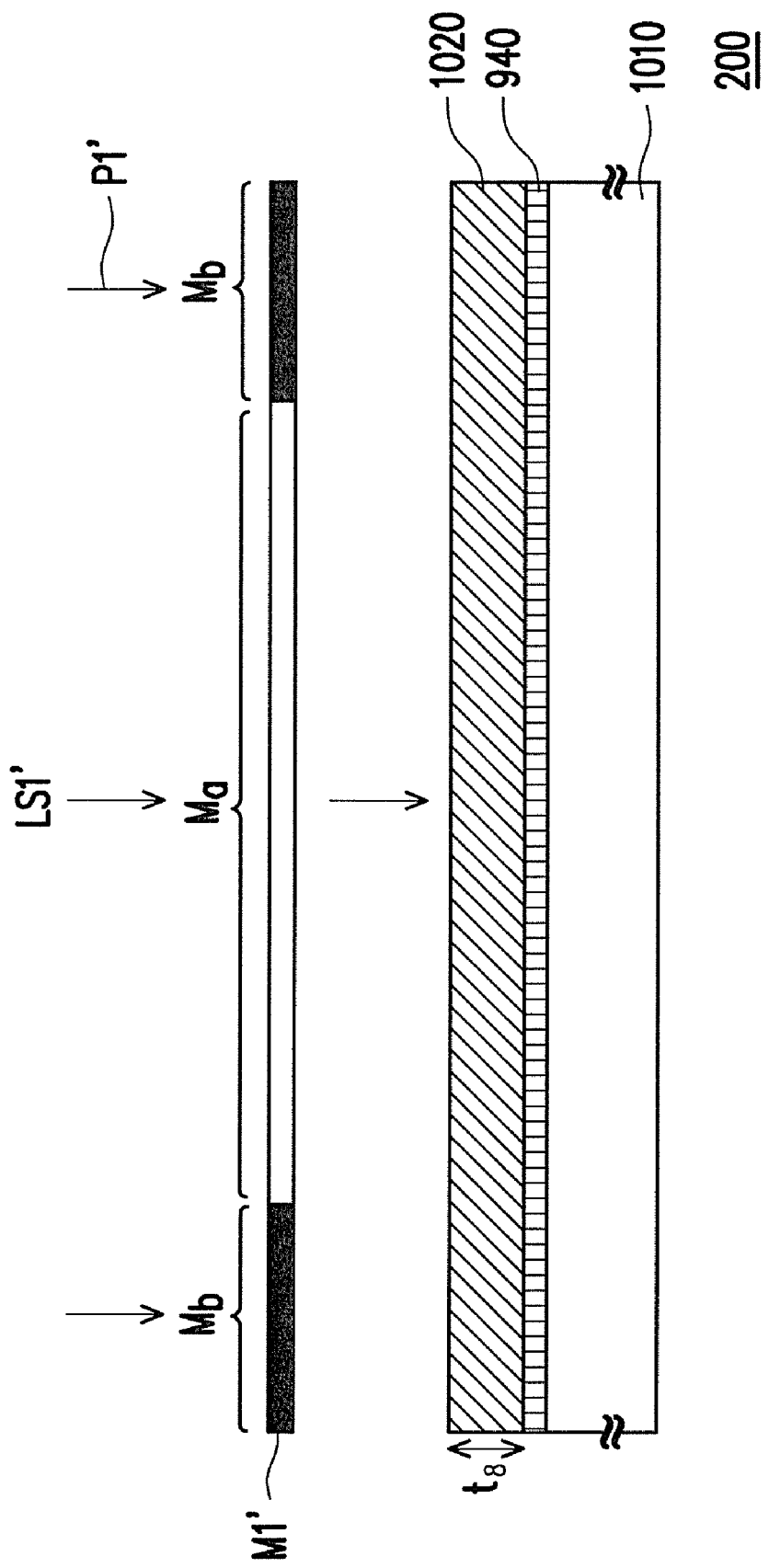

Then, referring to FIG. 10C, a first mask material layer 1020 having a thickness $t_8$ is formed on the reflective material layer 940, and the first time photolithography process P1' is performed to the first mask material layer 1020. Specifically, for example, the first mask material layer 1020 is made of a photosensitive material, e.g., a positive photoresist. In the instant embodiment, a light provided by a light source LS1' transmits through a mask M1' to perform the first photolithography process to the first mask material layer 1020. The mask M1' for example includes a light transmissive region $M_a$ and a light-shielding region $M_b$. Of course, in other embodiments, the first mask material layer 1020 can also be a negative photoresist, and in this case, positions of the light transmissive region $M_a$ and the light-shielding region $M_b$ of the mask M1' should be adjusted correspondingly.

Figure 10D:
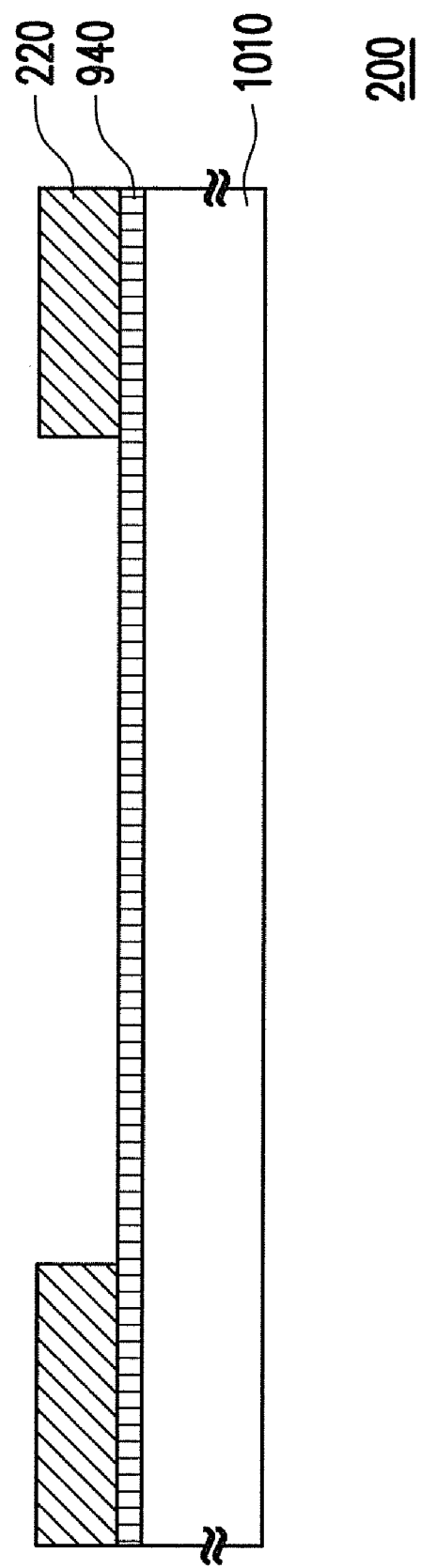

Therefore, after the first time photolithograph process P1' is performed to the first mask material layer 1020, the first mask material layer 1020 is patterned, so that a first mask pattern 220 is formed on the reflective material layer 940, as shown in FIG. 10D. The first mask pattern 220 is namely a light-shielding layer 220.

Figure 10E:
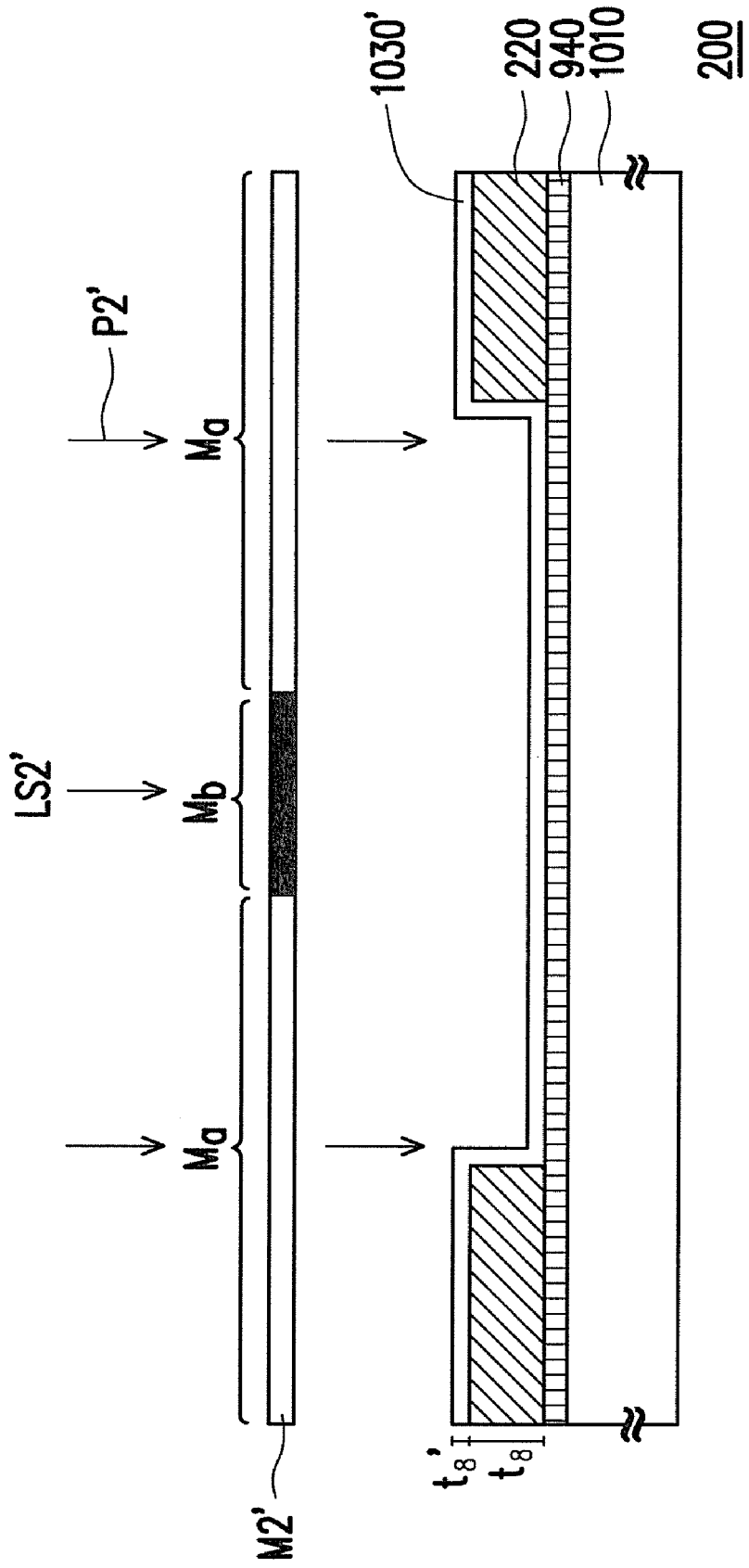

Then, referring to FIG. 10E, the second mask material layer 1030' is formed on the reflective material layer 940. The second mask material layer 1030' has a thickness $t_8'$ substantially smaller than the thickness $t_8$ of the first mask pattern 220. Further, the first mask material layer 1020 and the second mask material layer 1030' can be made of substantially the same material or different materials. Furthermore, the second time photolithography process P2' is performed to the second mask material layer 1030'. Specifically, for example, the second mask material layer 1030' is made of a photosensitive material, e.g., a positive photoresist. In the instant embodiment, a light provided by a light source LS2' transmits through a mask M2' to perform the second photolithography process P2' to the second mask material layer 1030'. The mask M2' can also include a light transmissive region $M_a$ and a light-shielding region $M_b$. Of course, in other embodiments, the second mask material layer 1030' can also be a negative photoresist, and in this case, positions of the light transmissive region $M_a$ and the light-shielding region $M_b$ of the mask M2' should be adjusted correspondingly.

Figure 10F:
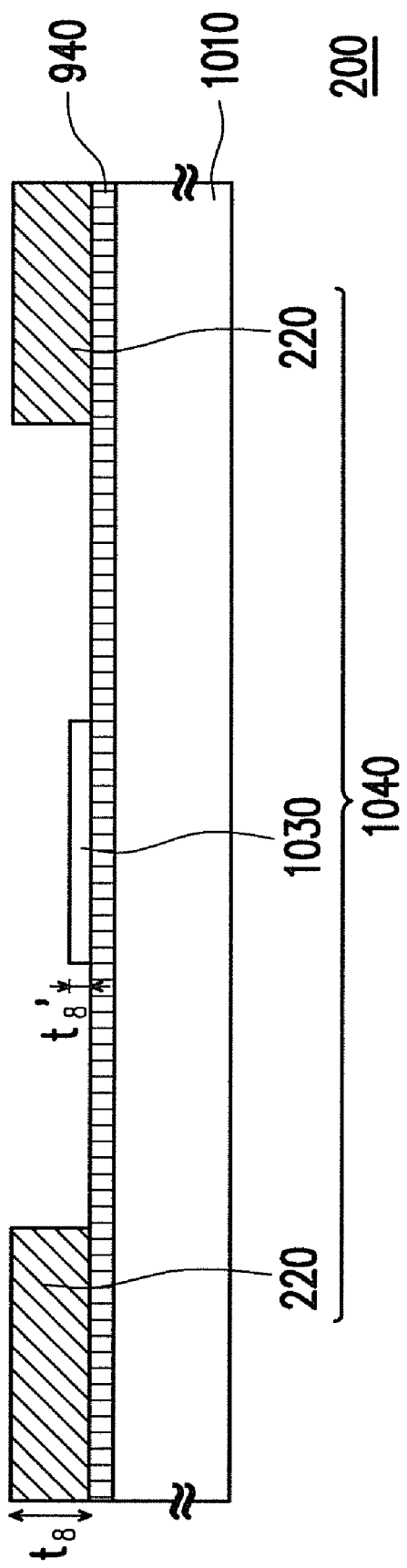

Therefore, after the second time photolithograph process P2' is performed to the second mask material layer 1030', the second mask material layer 1030' is patterned, so that the reflective material layer 940 is configured with a plurality of the second mask patterns 1030 thereon, as shown in FIG. 10F (only one second mask pattern 1030 is shown in FIG. 10F for illustration). In this case, the first mask pattern 220 and the second mask patterns 1030 on the reflective material layer 940 configure a mask layer 1040, while the thickness $t_8'$ of the second mask patterns 1030 is substantially smaller than the thickness $t_8$ of the first mask pattern 220.

Figure 10G:
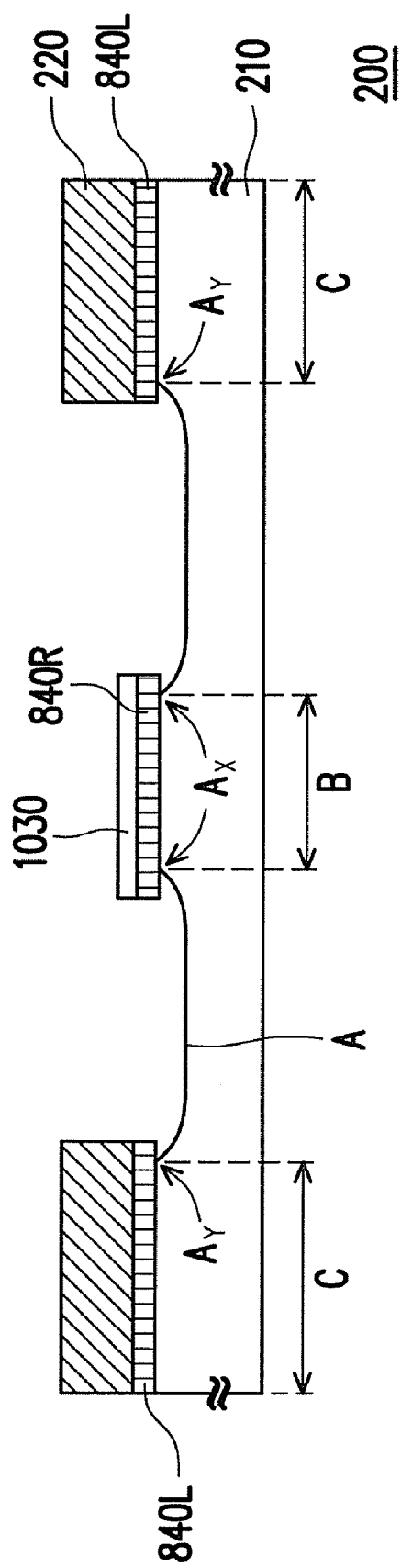

Then, an etching process is performed to the reflective material layer 940 and the base material 1010, to remove a part of the reflective material layer 940 and the base material 1010 which are not covered by the mask layer 1040, and thus forming the substrate 210 including the annular trough areas A, the light-shielding area C corresponding to the first mask pattern 220, and the central areas B corresponding to the second mask patterns 1030, the reflective layers 840R and the liner layers 840L, as shown in FIG. 10G. The reflective layers 840R are disposed on the central areas B, and the liner layers 840L are disposed between the light-shielding layer 220 and the substrate 210. Referring to FIGS. 2A and 10G, the light-shielding area C is positioned among the annular trough areas A, and each of the annular trough areas includes an inner edge $A_X$ connected with a corresponding central area B and an outer edge $A_Y$ connected with the light-shielding area C.

Specifically, the foregoing etching process is preferably an isotropic etching process, so as to configure undercuts at the substrate 210 under the first mask pattern 220 and the liner layers 840L. Similarly, undercuts are also configured at the substrate 210 under the second mask patterns 1030 and the reflective layers 840R. In other words, the first mask pattern 220 and the liner layers 840L extend from the outer edges $A_Y$ to the upsides of the annular trough areas A, and the second mask patterns 1030 and the reflective layers 840R extend from the inner edges $A_X$ to the upsides of the annular trough areas A.

Figure 10H:
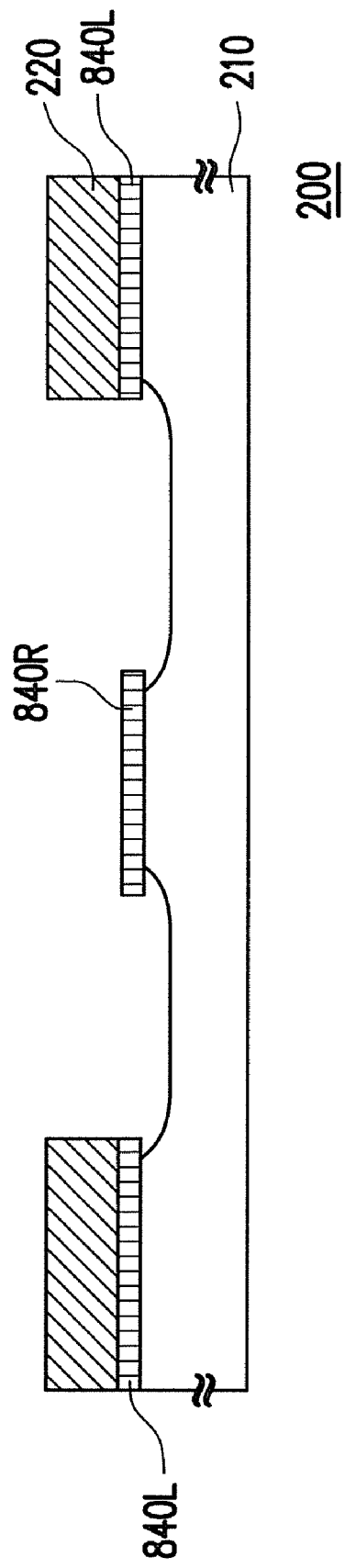

Then, a photoresist removing process is performed on the substrate 210 to remove the second mask patters 1030, as shown in FIG. 10H. Till now, the fabrication of the substrate 210 having a light-shielding layer 220 of the instant embodiment is substantially completed.

Then, subsequent process steps to be performed to the color filter substrate 200 are similar to the third embodiment, and can be learnt by referring to FIG. 5F and the related context, and thus are not to be iterated hereby. As shown in 5F, the color filter pattern 230 is in contact with a side surface C1 and a part of a bottom surface C2 of the light-shielding layer 220, and therefore it is helpful to fill up the outer edge position Y of the annular trough area A with the color filter pattern 230.

Although the first mask material layer 1020 and the second mask material layer 1030' of the instant embodiment are illustrated as made of a photosensitive material for example, they can also be made of reflective materials, non-transparent materials, light absorptive materials, such as metal, metal oxide, metal nitride, metal nitride oxide, metal carbide, metal silicide, metal alloy, metal alloy nitride, metal alloy nitride oxide, metal alloy carbide, metal alloy silicide, or other suitable conductive or insulating materials, or combinations of the foregoing. Details of the application can be learnt by referring to the discussion related to the second embodiment.

Furthermore, the method of manufacturing the instant embodiment and the configuration obtained therefrom an also be applied to the foregoing embodiments of FIGS. 7A and 7B, or other suitable configurations.

It should be specifically noted that all of the foregoing embodiments are illustrated in accordance with the partial top view of the color filter substrate of FIG. 2A as an example, in which the color filter substrate for example includes, but is not restricted to exactly include, red regions, green regions, and blue regions. Each of the regions, e.g., a red region, for example, includes one annular trough area A and one central area B. However, the present invention does not restrict that each of the regions includes only one annular trough area A and only one central area B. For example, referring to the top view diagram, the embodiment can be modified as: Each of the regions includes a plurality of annular trough areas and one central area, and each of the joints which the annular trough areas joint with another is positionally lower than the central area. Each of the regions includes a plurality of central areas and one annular area in accordance with the foregoing embodiments. Or each of the regions includes a plurality of central areas and a plurality of annular areas in accordance with the foregoing embodiments.

Figure 11:
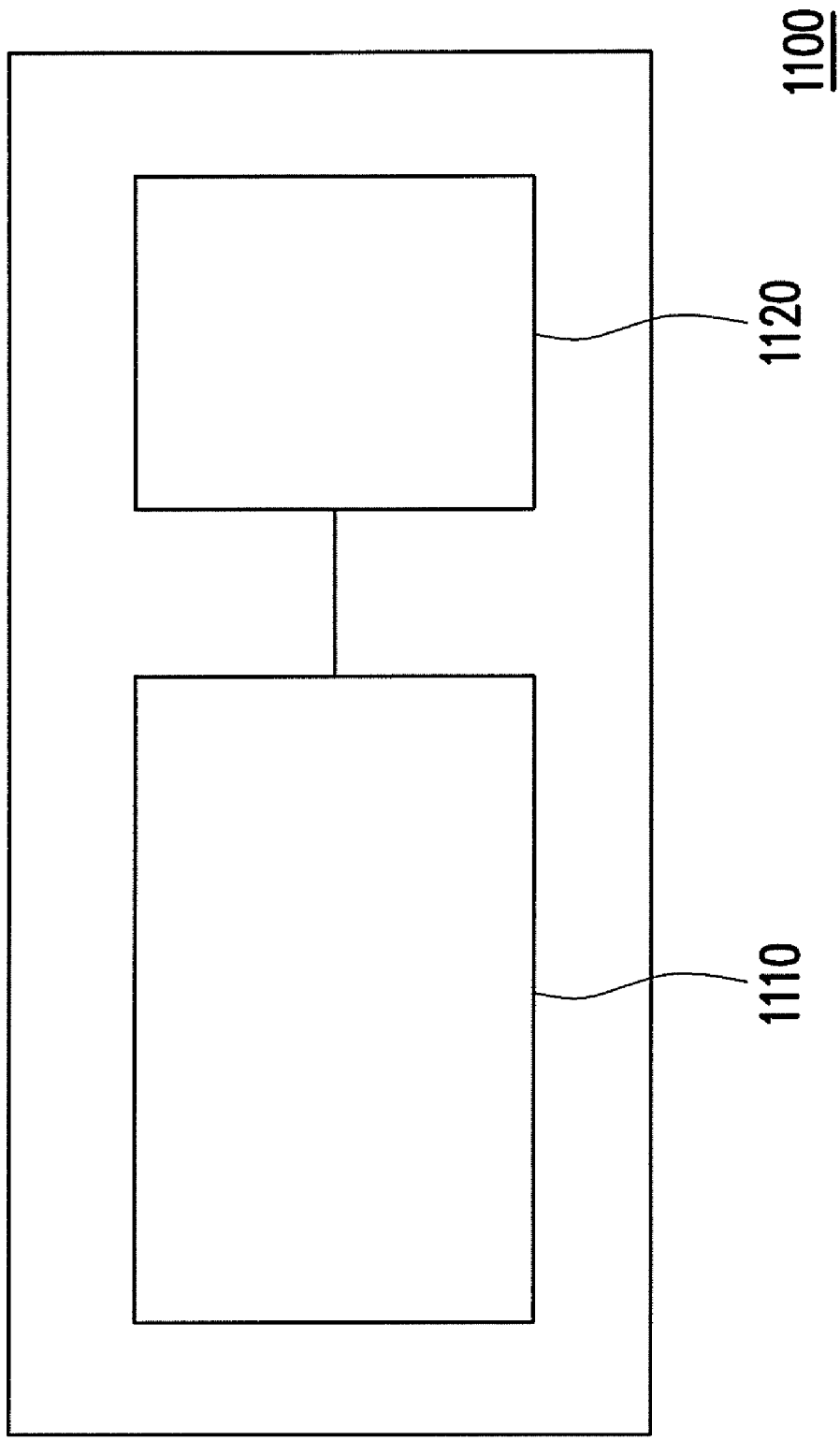
FIG. 11 is a schematic diagram illustrating an electronic apparatus according to an embodiment of the present invention.

The color filter substrate of the embodiments according to the present invention can be applied in an electronic apparatus, and the method of manufacturing the electronic apparatus includes the method of manufacturing the color filer substrate. Referring to FIG. 11, it illustrates that a display panel 1110 including a color filter substrate of the foregoing embodiments can be electrically connected to an electronic unit 1120 to configure an electronic apparatus 1100. It should be clarified that the electronic unit 1120 for example includes: a control unit, an operation unit, a processing unit, an input unit, a memory unit, a driving unit, a light emitting unit, a protection unit, a sensor unit, a detection unit, or other functional units, or a combination of the foregoing. The electronic apparatus 1100 can be a portable product (e.g., cellular phone, video recorder, camera, notebook computer, game player, watch, music player, emailer, map navigator, digital photograph, or like products), an audio/video product (e.g., audio/video player, or like products), a screen, a television, an indoor/outdoor board, or a panel in a projector, or the like.

In summary, the present invention provides a method of manufacturing a color filter substrate, adapted for forming color filter patterns having different thicknesses by configuring annular trough areas and central areas on the substrate. And therefore, the process steps of the method can be correspondingly simplified, so that the production cost and labour hours can also be saved. Further, the undercut configuration of the substrate adjacent to the outer edge position is adapted for configuring an even upper surface of the color filter patterns. As such, when the color filter substrate according to the present invention is applied in a display, the optical performance of the display can be drastically improved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A color filter substrate, comprising:
    a substrate, comprising a plurality of annular trough areas, a plurality of central areas, and a light-shielding area positioned among the annular trough areas, wherein each of the annular trough areas has an inner edge connected with a corresponding central area and an outer edge connected with the light-shielding area;
    a light-shielding layer, disposed on the light-shielding area, and extending from the outer edges to tops of the annular trough areas; and
    a plurality of color filter patterns, disposed on the annular trough areas and the central areas, and in contact with a side surface of the light-shielding layer and a part of a bottom surface of the light-shielding layer;
    wherein each of the central areas and one of the annular trough areas connected thereto is respectively covered by one of the color filters having a single color.

2. The color filter substrate according to claim 1, wherein a depth of each of the annular trough areas gradually decreases when approaching to the inner edge or the outer edge thereof.

3. The color filter substrate according to claim 1, wherein the color filter patterns comprise even upper surfaces.

4. The color filter substrate according to claim 3, wherein each of the color filter patterns further comprises:
    a first pattern, disposed on a corresponding one of the annular trough areas; and
    a second pattern, disposed on a corresponding one of the central areas, wherein the first pattern has a thickness which is substantially two times of a thickness of the second pattern.

5. The color filter substrate according to claim 1, wherein the light-shielding layer comprises a hydrophobic layer.

6. The color filter substrate according to claim 5, wherein the hydrophobic layer comprises a black matrix layer having a hydrophobically treated surface.

7. The color filter substrate according to claim 1, further comprising a plurality of reflective layers, wherein each of the reflective layers is disposed on one of the central areas.

8. The color filter substrate according to claim 7, wherein each of the reflective layers extends from a corresponding inner edge to the top of a corresponding annular trough area.

9. The color filter substrate according to claim 7, further comprises a plurality of liner layers, wherein each of the liner layers is disposed between the light-shielding layer and the substrate.

10. The color filter substrate according to claim 1, wherein the central areas and the light-shielding area are positioned at a same plane on the substrate.

11. An electronic apparatus, comprising a color filter substrate according to claim 1.

* * * * *